United States Patent
Chen et al.

(10) Patent No.: US 9,287,835 B2
(45) Date of Patent: Mar. 15, 2016

(54) LOW-QUIESCENT CURRENT HEADSET DRIVER

(71) Applicant: Broadcom Corporation, Irvine, CA (US)

(72) Inventors: Jianlong Chen, Irvine, CA (US); Sasi Kumar Arunachalam, Irvine, CA (US); Todd L. Brooks, Laguna Beach, CA (US)

(73) Assignee: Broadcom Corporation, Irvine, CA (US)

( * ) Notice: Subject to any disclaimer, the term of this patent is extended or adjusted under 35 U.S.C. 154(b) by 93 days.

(21) Appl. No.: 13/711,367

(22) Filed: Dec. 11, 2012

(65) Prior Publication Data

US 2014/0070889 A1 Mar. 13, 2014

Related U.S. Application Data

(60) Provisional application No. 61/698,384, filed on Sep. 7, 2012.

(51) Int. Cl.
*H03F 3/68* (2006.01)
*H03F 3/21* (2006.01)
(Continued)

(52) U.S. Cl.
CPC ............... *H03F 3/211* (2013.01); *H03F 1/0211* (2013.01); *H03F 1/0261* (2013.01);
(Continued)

(58) Field of Classification Search
CPC ........... H03F 1/36; H03F 3/68; H03F 3/3081; H03F 1/54; H03F 3/45475; H03F 3/602; H03F 1/0288; H03F 3/211; H03F 3/24; H03F 2200/451; H03F 3/604; H03F 3/72; H03F 3/181; H03F 3/193; H03F 3/245; H03F 3/45071; H03F 1/3205; H03F 3/19; H03F 3/195; H03F 3/21; H03F 1/0205; H03F 1/301; H03F 1/302; H03F 2003/45017
USPC ................ 330/84, 124 R, 260, 265, 271, 295
See application file for complete search history.

(56) References Cited

U.S. PATENT DOCUMENTS 7,078,965 B2 * 7/2006 Laletin ...................... 330/124 R
7,436,257 B2 * 10/2008 Park et al. ....................... 330/51
(Continued)

FOREIGN PATENT DOCUMENTS

| TW | 516269 B | 1/2003 |
|---|---|---|
| TW | 200830701 A | 7/2008 |
| TW | 200934105 A | 8/2009 |

OTHER PUBLICATIONS

Ding et al., "A High-Efficiency CMOS +22-dBm Linear Power Amplifier", IEEE Journal of Sound-Static Circuits, vol. 40, No. 9, Sep. 2005, pp. 1895-1900.
(Continued)

Primary Examiner — Khanh V Nguyen
(74) Attorney, Agent, or Firm — Fiala & Weaver P.L.L.C.

(57) ABSTRACT

A low quiescent current amplifier and driver having multiple amplifiers (e.g. Class AB and B amplifiers) work in concert to independently amplify all or a portion of a signal into multiple amplified signals combined into a unified signal. Operation of a second amplifier is slaved to operation of a first amplifier. Each amplifier may have its own feedback loop providing the same gain transfer function to align transitions of the multiple amplified signals. Operation of the first amplifier may be detected using a replica of a signal, stage or transconductance in the first amplifier. At the same threshold, operation of the first and second amplifiers may be transitioned, e.g., the second amplifier may transition between providing increasing or decreasing current and providing zero current while the first amplifier may transition between providing constant current and providing increasing or decreasing current.

20 Claims, 9 Drawing Sheets

(51) Int. Cl.
H03F 1/02 (2006.01)
H03F 3/187 (2006.01)
H03F 3/45 (2006.01)
H03F 3/72 (2006.01)

(52) U.S. Cl.
CPC ............ H03F 1/0277 (2013.01); H03F 3/187 (2013.01); H03F 3/45475 (2013.01); H03F 3/72 (2013.01); H03F 3/68 (2013.01); H03F 2200/405 (2013.01); H03F 2203/45528 (2013.01)

(56) References Cited

U.S. PATENT DOCUMENTS

| 8,269,559 | B2* | 9/2012 | Tadano | 330/285 |
| 2005/0237109 | A1 | 10/2005 | Laletin | |
| 2007/0176677 | A1 | 8/2007 | Apel | |
| 2008/0231358 | A1* | 9/2008 | Maemura | 330/124 R |
| 2010/0009725 | A1 | 1/2010 | Banerjea | |
| 2010/0127780 | A1 | 5/2010 | An et al. | |
| 2010/0127789 | A1 | 5/2010 | Kenly et al. | |
| 2011/0316633 | A1* | 12/2011 | Tadano | 330/295 |

OTHER PUBLICATIONS

Extended Search Report received for European Patent Application No. 13004056.1, mailed on Apr. 1, 2014, 4 pages.

Office Action Received for Taiwanese Patent Application No. 102130786, mailed Mar. 4, 2015, 7 pages (Official Copy Only).

Extended Search Report received for European patent application No. 14004197.1, mailed on Mar. 25, 2015, 9 pages.

* cited by examiner

LOW-QUIESCENT CURRENT HEADSET DRIVER

CROSS-REFERENCE TO RELATED APPLICATIONS

This application claims the benefit of U.S. Provisional Application No. 61/698,384, filed Sep. 7, 2012, the entirety of which is incorporated by reference herein.

BACKGROUND

Amplifiers are used in many circuits, including drivers, to amplify signal voltage and/or current. While amplifiers generally increase signal power, power amplifiers are specifically designed to significantly increase signal power. Drivers typically include one or more power amplifiers to perform work, e.g., to source or sink current to or from a load. Drivers drive signals to loads in a wide variety of applications, from audio signals in audio headsets to data, audio and video signals in communication lines, e.g., phone lines, coaxial cables and Ethernet cables.

Amplifier architecture is impacted by many factors, including capability (e.g. amplification range, signal frequency bandwidth), performance (e.g., signal quality, amplification linearity, noise rejection), manufacturing costs (e.g. die or board area consumption), implementation costs (e.g. additional components required) and operating costs (e.g., power consumption). It is desirable and advantageous to improve amplifier architecture in one or more of the foregoing factors.

Reduced power consumption is generally desirable for many mobile and fixed applications. For example, in mobile devices that rely on batteries, such as cellular telephones, tablets and music players, consumers view longer battery life as a desirable feature, yet high quiescent current reduces battery life. Quiescent current flows when an amplifier is operational, but not performing any work. However, reducing quiescent current typically reduces amplifier capability and/or performance while increasing amplifier implementation costs by requiring additional circuitry, such as switching regulators and expensive external inductors. Accordingly, conventional portable devices generally lack high fidelity audio or long battery life.

Several classes of amplifier exhibit different quiescent current characteristics. For example, a Class-A amplifier consumes current in the absence of a signal, i.e., it has a large quiescent current, which makes it unattractive for low power consumption applications. A Class-B amplifier does not consume current in the absence of a signal, but has cross-over distortion that may degrade its signal quality. A class AB amplifier has less quiescent current than a class A amplifier and less cross-over distortion than a class B amplifier.

A compromise between improved performance and lower quiescent current may be reached by implementing more than one amplifier stage within an amplifier. One technique is to deploy a class AB amplifier stage to provide lower levels of output power to the load and a class B amplifier stage to provide higher levels of output power to the load. However, amplification stage control is difficult. Poor control of thresholds to activate and deactivate amplifier stages may degrade performance by causing undesirable transitions between amplification stages and nonlinear amplification. Good threshold control typically requires additional circuitry, which increases manufacturing and/or implementation costs and also may degrade performance by causing larger parasitic capacitance that impacts stability.

Accordingly, there is a need to overcome the drawbacks and deficiencies in the art by providing a multi-stage amplifier and control circuitry with improved performance to provide smooth transitions between the amplifier stages and linear amplification by overcoming threshold and amplification mismatches between the amplifiers and doing so without increasing or by reducing manufacturing costs, implementation costs and operating costs compared to conventional techniques.

BRIEF SUMMARY

Methods, systems, and apparatuses are described for a low quiescent current amplifier and driver having multiple amplifiers (e.g. Class AB and B amplifiers) working in concert to independently amplify all or a portion of a signal into multiple amplified signals combined into a unified signal, where operation of a second amplifier is slaved to operation of a first amplifier, each amplifier may have its own feedback loop providing the same gain transfer function to align transitions of the multiple amplified signals, operation of the first amplifier may be detected using a replica of a signal, stage or transconductance in the first amplifier, and at the same threshold, operation of the first and second amplifiers may be transitioned, e.g., the second amplifier may be activated while the first amplifier may transition operation necessary for desired operation, which results in the low quiescent current amplifier and driver providing improved performance with smooth transitions between the amplified signals and linear amplification by overcoming threshold and amplification mismatches between the amplifiers without increasing or by reducing manufacturing, implementation and/or operating costs, substantially as shown in and/or described herein in connection with at least one of the figures, as set forth more completely in the claims.

BRIEF DESCRIPTION OF THE DRAWINGS/FIGURES

The foregoing summary, as well as the following detailed description, is better understood when read in conjunction with the accompanying drawings. The accompanying drawings, which are incorporated herein and form part of the specification, illustrate a plurality of embodiments and, together with the description, further serve to explain the principles involved and to enable a person skilled in the relevant art(s) to make and use the disclosed technologies. However, embodiments are not limited to the specific implementations disclosed herein. Unless expressly indicated by common numbering, each figure represents a partially or entirely different embodiment where components and steps in each embodiment are intentionally numbered differently compared to potentially similar components in other embodiments. The left-most digit(s) of a reference number identifies the number of the figure in which the reference number first appears.

Figure 1:
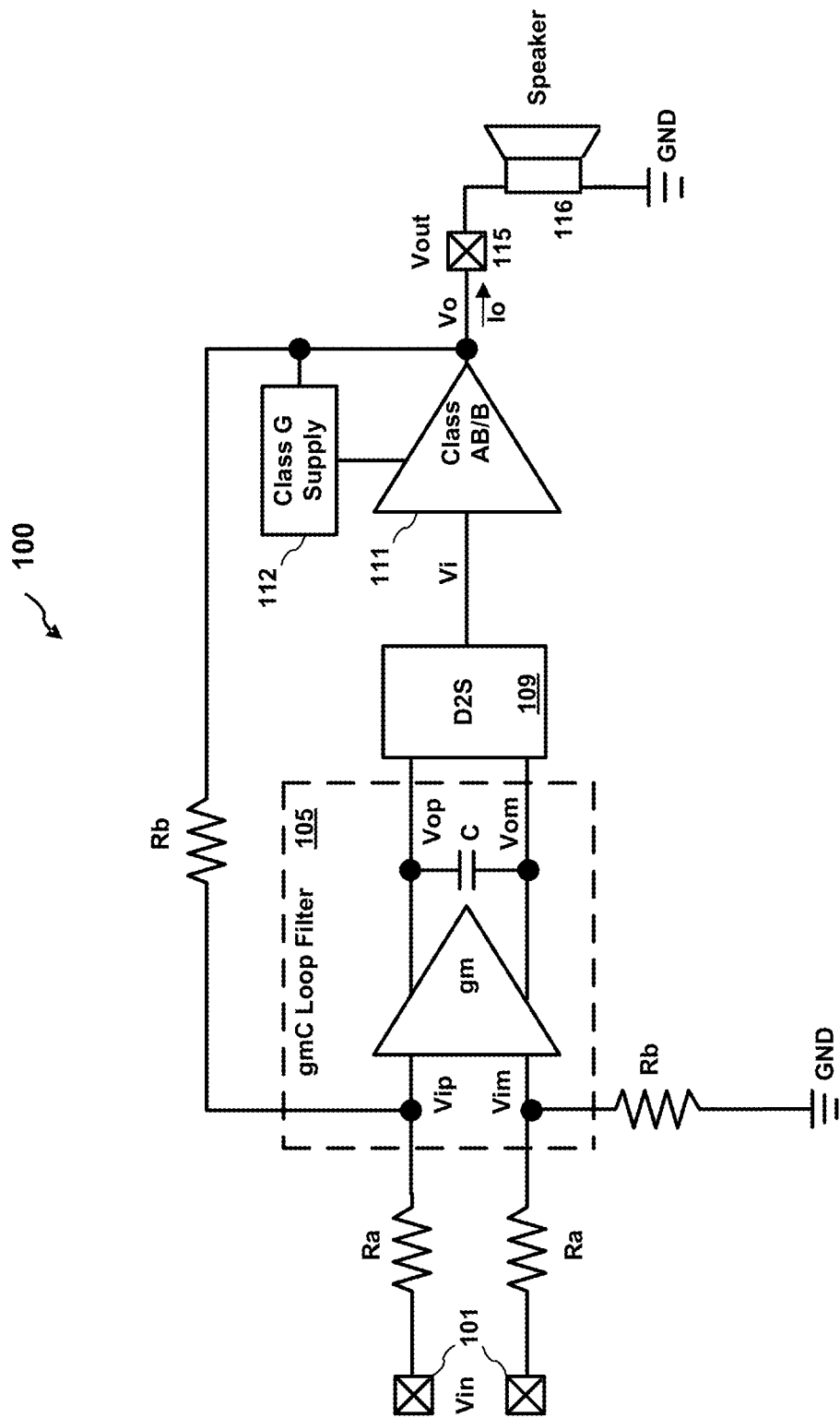
FIG. 1 shows a block diagram of an exemplary embodiment of a headphone driver system.

Exemplary embodiments will now be described with reference to the accompanying figures.

DETAILED DESCRIPTION

I. Introduction

Reference will now be made to embodiments that incorporate features of the described and claimed subject matter, examples of which are illustrated in the accompanying drawings. While the technology will be described in conjunction with various embodiments, it will be understood that the embodiments are not intended to limit the present technology. The scope of the subject matter is not limited to the disclosed embodiment(s). On the contrary, the present technology is intended to cover alternatives, modifications, and equivalents, which may be included within the spirit and scope the various embodiments as defined herein, including by the appended claims. In addition, in the following detailed description, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the embodiments presented.

References in the specification to "embodiment," "example" or the like indicate that the subject matter described may include a particular feature, structure, characteristic, or step. However, other embodiments do not necessarily include the particular feature, structure, characteristic or step. Moreover, "embodiment," "example" or the like do not necessarily refer to the same embodiment. Further, when a particular feature, structure, characteristic or step is described in connection with an embodiment, it is submitted that it is within the knowledge of one skilled in the art to effect such feature, structure, or characteristic in connection with other embodiments whether or not those other embodiments are explicitly described.

Certain terms are used throughout the following description and claims to refer to particular system components and configurations. As one skilled in the art will appreciate, various skilled artisans and companies may refer to a component by different names. The discussion of embodiments is not intended to distinguish between components that differ in name but not function. In the following discussion and in the claims, the terms "including" and "comprising" are used in an open-ended fashion, and thus should be interpreted to mean "including, but not limited to . . . " Also, the term "couple" or "couples" is intended to mean either an indirect or direct electrical connection. Thus, if a first device couples to a second device, that connection may be through a direct electrical connection or through an indirect electrical connection via other devices and connections.

II. Exemplary Low Quiescent Current Headset Driver

Methods, systems, and apparatuses will now be described for a low quiescent current amplifier and driver having multiple amplifiers (e.g. Class AB and B amplifiers) working in concert to independently amplify all or a portion of a signal into multiple amplified signals combined into a unified signal. As will be described, operation of a second amplifier is slaved or otherwise made dependent on the operation of a first amplifier. Each amplifier may have its own feedback loop providing the same gain transfer function to align transitions of the multiple amplified signals. Operation of the first amplifier may be detected using a replica of a signal, stage or transconductance in the first amplifier. The replica and/or feedback control may permit each amplifier to transition at the same threshold. For example, at the same threshold, operation of the first and second amplifiers may be transitioned, e.g., the second amplifier may be activated while the first amplifier may transition operation necessary for desired operation. The low quiescent current amplifier and driver provide improved performance with smooth transitions between the amplified signals and linear amplification by overcoming threshold and amplification mismatches between the amplifiers without increasing or by reducing manufacturing, implementation and operating costs.

In one embodiment, a device (e.g. amplifier, driver) comprises a first amplifier configured to receive and amplify a first signal into a first amplified signal; a second amplifier configured to receive and amplify the first signal into a second amplified signal, where the device is configured to combine or unify the first and second amplified signals into a combined or unified amplified signal; and a controller configured to slave operation of the second amplifier to operation of the first amplifier.

The first and second amplifiers may be in the same amplifier class or they may be in a different class. For example, the first amplifier may comprise a class AB amplifier and the second amplifier may comprise a class B amplifier. As another example, each amplifier may be the same general type, such as two-stage Miller compensated amplifier The class of each amplifier may be defined by the architecture and/or operation of each respective amplifier. Similarly, one or more amplifiers may be rendered in a different class by power supply modulation. For example, the first and second amplifiers may be configured to be powered by a class G or class H modulated power supply.

The first amplifier may be configured to amplify a first portion of the first signal, while the second amplifier may be configured to amplify a second portion of the first signal. The first and second portions may be the same or different and each portion may comprise one of all or less than all of the first signal.

An activation signal for the second amplifier may be the first amplified signal, or may be based on, e.g., derived from, the first amplified signal or another signal providing an indication of operation of the first amplifier. When the activation signal reaches an activation or transition threshold, the device may be configured to transition amplification. In this way, operation of the second amplifier is slaved to or otherwise made dependent on operation of the first amplifier. For example, at the threshold, the device may activate amplification of the first signal by the second amplifier and transition amplification of the first signal by the first amplifier, where the second amplifier may be inactive before the first amplified signal reaches the threshold.

The second amplifier may be activated after a bias is provided to the second amplifier, the bias being provided when a bias signal based on the first amplified signal reaches a bias threshold. Like the activation signal, the bias signal may also be the first amplified signal, or may be based on, e.g., derived from, the first amplified signal or another signal providing an indication of operation of the first amplifier. The bias threshold may be lower than the activation or offset threshold in order to prepare the second amplifier for activation.

Operation of the first amplifier may be detected using a replica of a signal, stage or transconductance in the first amplifier. For example, the controller may be configured to replicate part or all of the first amplifier and use the replica to indicate operation of the first amplifier. The replica may be a replica of the first amplified signal, a replica of a transconductance in the first amplifier or a replica of a component or stage of the first amplifier. The replica may be scaled in full (i.e. equal to), less than or greater than the replicated portion of the first amplifier.

One or both the first and second amplifiers may have multiple stages. For example, the first amplifier may have a second stage coupled to the output of a first stage. The replica in the controller may comprise a replica of at least a portion of the second stage coupled to the output of the first stage. Output of the first stage may be couple to an input of the second stage and an input of the replica. Operation of the replica may provide the controller with a replica of the first amplified signal.

Each of the first and second amplifiers may have feedback. For example, the first amplifier may comprise a first feedback and the second amplifier may comprise a second feedback. Feedback gain provided by the first and second feedbacks may be essentially the same so that the first and second amplifiers have essentially the same gain transfer function. As a result, first and second amplified signals may be aligned during transitions. Alignment results in smooth, as opposed to abrupt, transitions. Transitions may occur, for example, during activations and deactivations of the second amplifier as operation of the first amplifier rises, falls, plateaus or otherwise transitions relative to one or more transition thresholds. Limiting and clamping are examples of other types of transitions in operation.

In some embodiments, the device may comprise a traditional or a novel multi-stage loop filter or integrator in a signal path preceding the first and second amplifiers. In a novel implementation, a first stage of the multi-stage loop filter or integrator may comprise a gain stage having gain A and a second stage may comprise a transconductance stage having a first transconductance and a differential capacitor load having a first capacitance. An advantage of the novel gain stage is that it provides low noise performance and a unity gain crossover frequency that would otherwise require, in absence of the gain stage, a second transconductance larger than the first transconductance and a second capacitance larger than the first capacitance. This novel technique reduces manufacturing, implementation and operating costs compared to conventional techniques.

In another embodiment, a method comprises receiving a first signal; amplifying, in a first amplifier, the first signal into a first amplified signal; amplifying, in a second amplifier, the first signal into a second amplified signal; combining the first and second amplified signals into a combined amplified signal; and controlling operation of the first and second amplifiers by slaving operation of the second amplifier to operation of the first amplifier. The first and second amplifiers amplify respective first and second portions of the first signal. These portions may be the same or they may be different and each portion may comprise one of all or less than all of the first signal.

The method may further comprise detecting that an activation signal based on the first amplified signal has reached an activation threshold; and then, in response to the activation threshold being reached, activating amplification of the first signal by the second amplifier and transitioning amplification of the first signal by the first amplifier, where the second amplifier is inactive before the activation signal reaches the activation threshold. Common thresholds to transition both amplifiers at the same times helps reduce distortion during transitions. Prior to the transitions, e.g., activating amplification of the first signal by the second amplifier and transitioning amplification of the first signal by the first amplifier, the method may further comprise detecting that a bias signal based on the first amplified signal has reached a bias threshold; and providing bias to the second amplifier to prepare the second amplifier for activation.

In some embodiments, the method further comprises replicating the first amplified signal, where the replicated signal indicates the operation of the first amplifier. In various embodiments, operation of the first amplifier may be detected using a replica of a signal, component or stage or transconductance in the first amplifier for use in detecting operation of the first amplifier. The replica may be scaled in full (i.e. equal to), less than or greater than the replicated portion of the first amplifier.

In some embodiments, the method may further comprise providing a first feedback to the first amplifier; and providing a second feedback to the second amplifier. The first and second amplifiers may be the same or different classes of amplifiers. However, they may have essentially the same gain transfer function so that the first and second amplified signals are aligned for combination. Accordingly, the feedback gain provided by the first amplifier and the feedback gain provided by the second feedback may provide feedback gain that provides essentially the same gain transfer function for the first and second amplifiers.

In another embodiment, a device may comprise a first output stage configured to receive and amplify a first portion of a first signal into a first amplified signal; and a second output stage configured to receive and amplify a second portion of the first signal into a second amplified signal. The first and second portions may be the same or different and each portion may comprise one of all or less than all of the first signal. The device is configured to combine the first and second amplified signals into a combined amplified signal. A first feedback is coupled to an output of the first output stage and a second feedback is coupled to an output of the second output stage. Although the particular components and values need not be the same in the first and second feedbacks, the feedback gain ratios of the first and second feedbacks may be essentially the same so that the first and second amplifiers have essentially the same gain transfer function. The device may further comprise an activation control, which may have a replica of the first output stage to detect operation of the first amplifier. The device may further comprise a first input stage having an output coupled to an input of the first output stage and to an input of the replica. The activation control is configured to slave operation of the second amplifier to operation of the first amplifier according to the operation indicated by the replica.

FIG. 1 shows a block diagram of an exemplary embodiment of a headphone driver system. As shown in FIG. 1, headphone driver system 100 comprises gmC loop filter 105, D2S (i.e. differential to single-ended converter) 109, class AB/B amplifier 111, class G supply 112 and speaker 116. Speaker 116 indicates this exemplary driver is an audio driver, although the driver may be any driver. The driver is shown coupled between differential input port 101 and single-ended output port 115.

The driver is shown with a feedback network comprising two sets of series-coupled resistors Ra and Rb. A first set of series-coupled resistors Ra and Rb are coupled between a first input terminal 101 and output terminal 115. The series connection between the first set of series-coupled resistors Ra and Rb is coupled to positive input Vip to gmC loop filter 105. A second set of series-coupled resistors Ra and Rb are coupled between a second input terminal 101 and ground GND. The series connection between the second set of series-coupled resistors Ra and Rb is coupled to negative input Vim to gmC loop filter 105. Of course, no feedback or different driver feedback may be implemented in other embodiments.

Differential input Vin is provided to the driver at differential input port 101. Differential input Vin is coupled to differential input Vip, Vim to GmC loop filter 105 through input resistors Ra. GmC loop filter 105 comprises transconductance amplifier gm and differential load resistor C coupled across differential output Vop, Vom of gmC loop filter 105.

Figure 2:
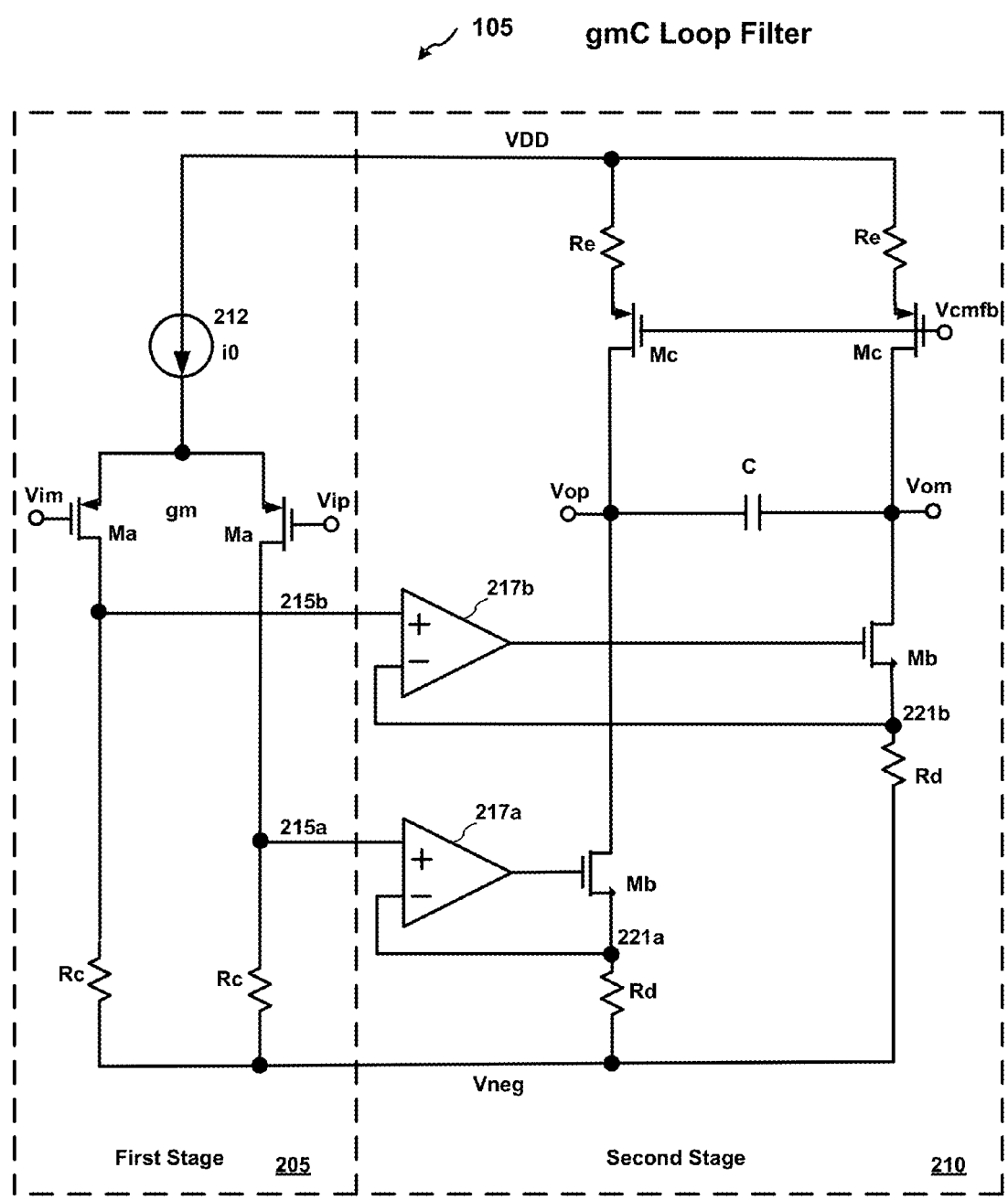
FIG. 2 shows an exemplary embodiment of a gmC loop filter circuit.

FIG. 2 shows an exemplary embodiment of a gmC loop filter circuit, such as gmC loop filter 105. In the embodiment shown in FIG. 2, gmC loop filter 105 is a first order loop filter that comprises first stage 205 and second stage 210. First stage 205 comprises a gain stage having gain A. Second stage 210 comprises a transconductor with a differential load capacitor. Buffering is provided between gain stage 205 and transconductance stage 210 through the configuration of amplifiers 217a and 217b in feedback with devices Mb. GmC loop filter 105 may also be considered three stages, e.g., if amplifiers 217a and 217b are considered an intermediate stage. GmC loop filter 105 is a differential circuit having differential input Vim, Vip and differential output Vop, Vom.

First stage 205 comprises current source 212, gain transistors Ma and gain resistors Rc. A differential signal received through differential input nodes Vim, Vip controls respective gate nodes of gain transistors Ma, which are PMOS transistors. Source nodes of gain transistors Ma are coupled to current source 212. Current source 212, which is coupled to positive power supply VDD, supplies current i0 to gain transistors Ma. In turn, and in accordance with control provided by the differential input signal supplied to their gate nodes, gain transistors Ma supply current to gain resistors Rc. Gain resistors Rc operate as load resistors. First nodes of gain resistors Rc are coupled, respectively, to drain nodes of gain transistors Ma at nodes 215a and 215b. The opposing nodes of gain resistors Rc are coupled to negative power supply Vneg. Accordingly, a voltage develops across gain resistors Rc having a gain A relative to a voltage level of a differential input signal received through differential input nodes Vim, Vip. Positive input nodes of amplifiers 217a, 217b are coupled, respectively, to nodes 215a, 215b. Amplifiers 217a, 217b are configured in feedback with devices Mb to provide buffering and drive the voltages on nodes 215a, 215b in first stage 205 onto nodes 221a, 221b in second stage 210. Second stage 210 comprises current source transistors Mc, current source resistors Re, differential load capacitor C, transconductance transistors Mb, transconductance resistors Rd and amplifiers 217a, 217b. First nodes of current source resistors Re are coupled to positive voltage supply VDD while their second terminals are coupled to a source node of a respective current source transistor Mc. Drain nodes of current source transistors are coupled to respective drain nodes of transconductance transistors Mb. Gate nodes of current source transistors Mc are coupled to and controlled by common mode voltage feedback Vcmfb to source appropriate current to transconductance transistors Mb. Gate nodes of transconductance transistors Mb are coupled to and controlled by respective outputs of amplifiers 217a, 217b. Source nodes of transconductance transistors Mb are coupled, respectively, to first nodes of transconductance resistors Rd at nodes 221a, 221b. Feedback to negative nodes of amplifiers 217a, 217b is also coupled to nodes 221a, 221b. Second nodes of transconductance resistors Rd are coupled to negative voltage supply Vneg. Transconductance transistors Mb and resistors Rd convert differential voltage at the output of amplifiers 217a, 217b to differential current. Differential capacitor C is coupled across output nodes Vop, Vom.

The reasons for the architecture and operation of first and second stages 205, 210 are better understood by an explanation in terms of problems and solutions. An audio driver has a relatively low bandwidth, e.g., 0 to 20 kHz. It is desirable to have high gain at a signal of interest, in this case relatively low frequencies. An integrator is well-suited for such an application because it provides high DC gain. Wider bandwidth operation generally requires more power and increases the difficulty level of stabilization across the bandwidth. To limit bandwidth, an integrator needs a low frequency unity gain crossover, which is generally given by transconductance (gm) divided by capacitance. This requires large capacitance or a low transconductance (gm). The problem with a low transconductance is that it increases noise, where noise is given by the inverse square root of transconductance. Thus, a large transconductance decreases noise, but increases unity gain crossover frequency while a larger capacitor to decrease unity gain crossover frequency increases component costs and device dimensions. The goal becomes reducing costs to implement a low noise integrator with a low frequency unity gain crossover and high gain at DC with a small capacitor.

The solution is to add gain in first stage 205 and to scale transconductance and capacitance in second stage 210 to achieve both low-noise and low frequency unity gain crossover with a small capacitor. Transconductance resistors Rd help scale transconductance in second stage 210. The result is that a small transconductance and a small capacitance in the second stage achieves the goals of low noise, low frequency unity gain crossover and a small capacitor. Overall transconductance across first and second stages is given by transconductance gm in first stage 205 divided by the ratio of Rd/Rc. Rd may be in the range of several hundred thousand to millions of Ohms. Thus, implementing a transconductance amplifier in first stage 205 having transconductance gm and gain A and providing the amplified signal as an isolated voltage input to second stage 210 permits implementation of a different, lower transconductance and smaller capacitance in second stage 210 because the first stage substantially reduced the noise.

In this implementation, second stage 210 implements a transconductance stage having a first transconductance and a differential load capacitor C having a first capacitance. The present implementation provides low noise performance and a unity gain crossover frequency that would otherwise require, in absence of the gain stage, a second transconductance larger than the first transconductance and a second capacitance larger than the first capacitance implemented in the second stage. For example, in one embodiment with an Rd/Rc ratio of 25, differential load capacitor C having a value of 4 pF provides a bandwidth of approximately 400 kHz for loop filter 105. This novel technique reduces manufacturing, implementation and operating costs compared to conventional techniques.

Another advantage of the present architecture is that loop filter 105 may be a first-order loop filter. Traditional headphone drivers require a high-order loop filter to suppress non-linearity and power supply disturbance in their output stages. However, high gain in class AB/B amplifier 111 permits loop filter 105 to be a simpler first order loop filter despite intentional power supply variation introduced by class G supply 112.

Returning to FIG. 1, differential to single-ended block D2S 109 converts a differential signal at differential output Vop, Vom from gmC loop filter 105 into a single-ended signal Vi input to class AB/B amplifier 111. D2S 109 ensures proper signal gain throughout the driver to provide desired dynamic range (DR). Other embodiments may or may not implement a differential to single-ended converter.

Class AB/B amplifier 111 receives single-ended signal Vi and generates an output signal Vout having output voltage Vo and output current Io that is output to speaker 116 through output node 115. Speaker 116 is coupled between output node 115 and ground GND. Class ABB amplifier 111 is shown as being supplied with power by class G supply 112. When output voltage Vo rises above a threshold, class G supply 112 increases the power supply for a driver output stage in class AB/B amplifier 111. When output voltage Vo falls below the threshold, class G supply 112 decreases the power supply for the driver output stage in class AB/B amplifier 111. Thus, class G supply 112 efficiently reduces power consumption.

Exemplary architecture and operation of class AB/B amplifier 111 are shown in remaining FIGS. 3-9. As these embodiments show, class AB/B amplifier 111 provides an adaptive class B driver control with inherently aligned amplifier transition thresholds to overcome inaccuracy or lack of alignment in class B activation threshold VthB and class AB transition threshold VthAB. In a class AB/B amplifier, the class AB amplifier may amplify small signals while the class B amplifier amplifies larger signals. As output voltage Vo and output current Io increase, the class B amplifier provides an increasing share of output current Io. A lack of accuracy in transition thresholds to transition the class AB amplifier and activate the class B amplifier results in loss of efficiency and linearity degradation, i.e., higher operating costs and lower performance. The adaptive class B driver control disclosed herein inherently aligns transition thresholds for the Class A and class AB amplifiers, resulting in improved performance and reduced power consumption.

Figure 3:
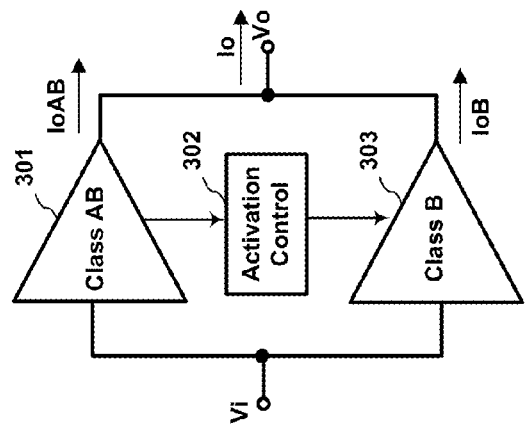
FIG. 3 shows a block diagram of an exemplary embodiment of a class AB/B amplifier.

FIG. 3 shows a high level block diagram of an exemplary embodiment of a class AB/B amplifier. Class AB/B amplifier 111 comprises class AB amplifier 301, controller or activation control 302 and class B amplifier 303. In other embodiments, amplifiers 301, 303 may be in the same or different classes and those classes may be the same or different than class AB and class B. Class AB amplifier 301 and class B amplifier 303 may each comprise, for example, a two-stage Miller compensated amplifier. In other embodiments, class AB amplifier 301 and class B amplifier 303 may comprise another type of amplifier with one or more stages.

The architecture illustrates that class AB amplifier 301 and class B amplifier 303 each receive and amplify the same input signal Vi. Class AB amplifier 301 amplifies input signal voltage Vi into a first amplified signal, i.e., class AB output current IoAB. Class B amplifier 303 amplifies input signal voltage Vi into a second amplified signal, i.e., class B output current IoB. Class AB/B amplifier 111 is configured to combine or unify class AB and class B output signals IoAB and IoB into a combined or unified amplified signal, i.e., class AB/B output current Io having output voltage Vo.

Controller or activation control 302 is configured to slave operation of class B amplifier 303 to operation of class AB amplifier 301. Slaving operation of one amplifier to another is defined as the existence of a dependent or co-dependent link between the operation of the amplifiers where operation of an amplifier causes a transition or adjustment in operation of another amplifier.

Figure 4:
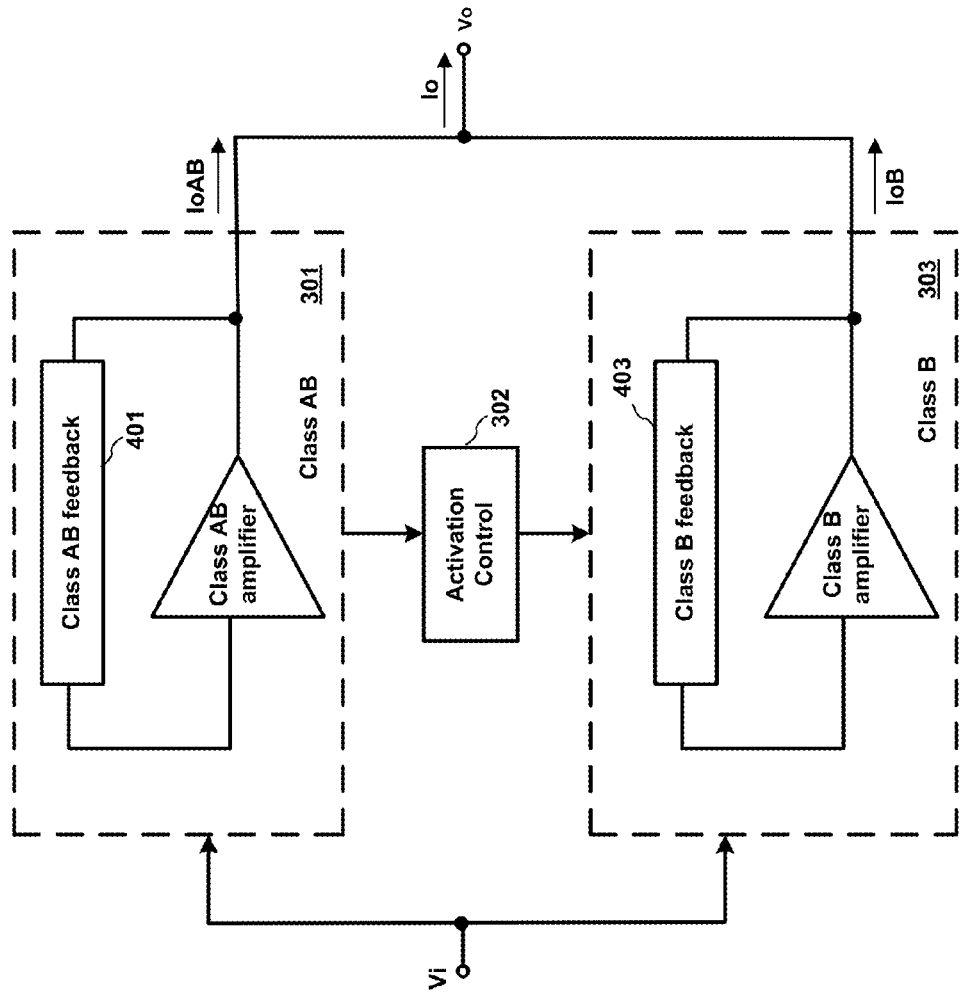
FIG. 4 shows a block diagram of an exemplary embodiment of a class AB/B amplifier.

FIG. 4 shows a more detailed block diagram of an exemplary embodiment of a class AB/B amplifier. Class AB/B amplifier 111 comprises class AB amplifier 301, controller or activation control 302 and class B amplifier 303. In this embodiment, class AB amplifier 301 is shown with class AB feedback 401 while class B amplifier 303 is shown with class B feedback 403. Class AB and B feedbacks 401, 403 are independent of one another. However, when operating class AB and B amplifiers 301, 303 together, synergistically, to perform as one amplifier, proper alignment of transition thresholds and amplified signals is important to avoid non-linear or abrupt distortions in the unified amplified output signal.

In some embodiments, feedback gain provided by class AB and class B feedbacks 401, 403 may be essentially the same so that the first and second amplifiers have essentially the same gain transfer function. Essentially the same is defined as the same with a tolerance of +/−10%. In other embodiments, feedback gain provided by class AB and class B feedbacks 401, 403 may be different, but the overall gain transfer function of class AB and class B amplifiers 301, 303 may be essentially the same. As a result of transfer function alignment, class AB and class B amplified output signals may be proportionally aligned during transitions. Transfer function alignment results in smooth, as opposed to abrupt, transitions. These transitions may occur, for example, during activations and deactivations and other types of transitions in operation of one or more amplifiers as operation of the first amplifier rises and falls relative to one or more transition thresholds.

Figure 5:
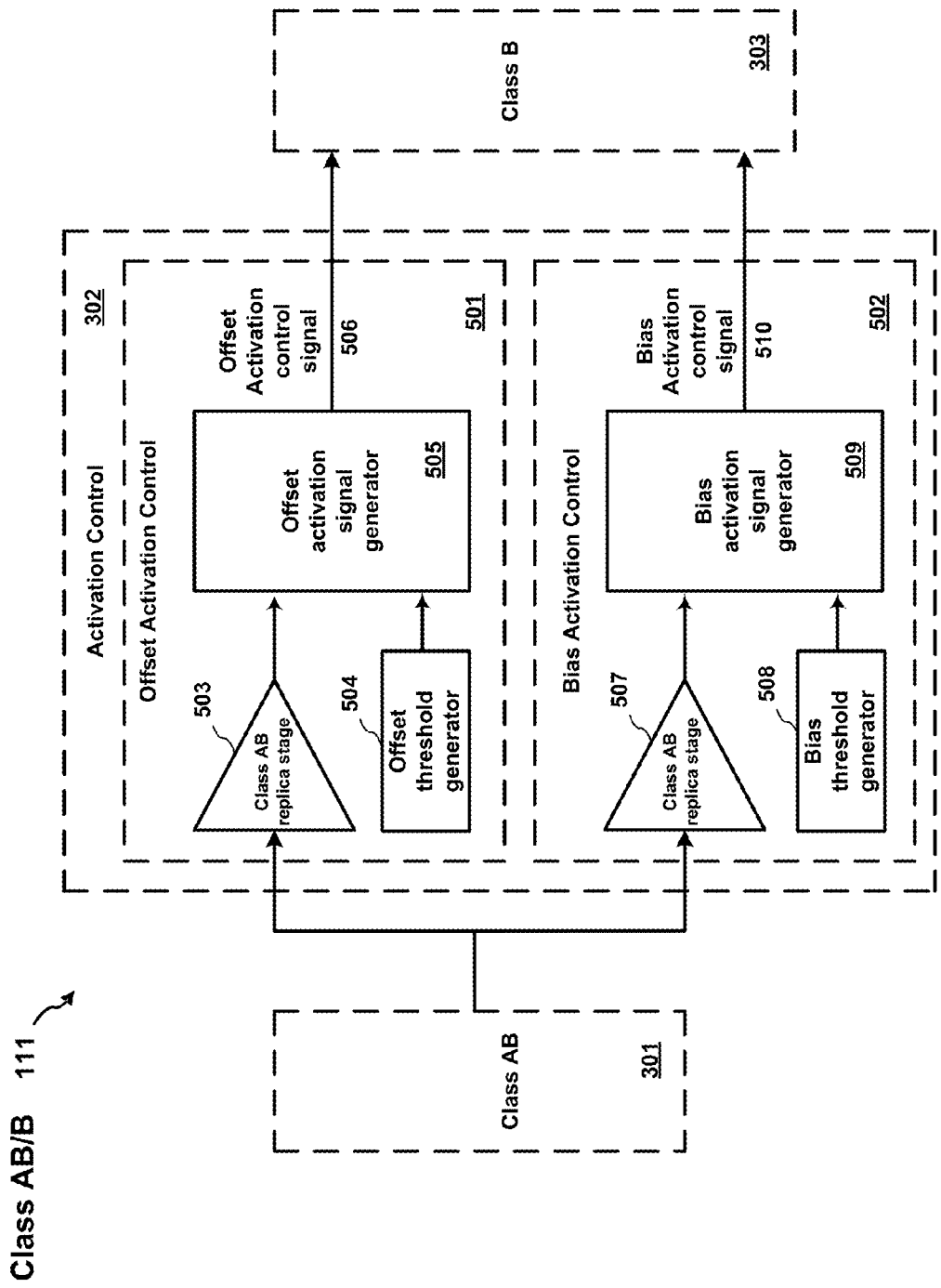
FIG. 5 shows a shows a block diagram of an exemplary embodiment of class AB/B amplifier activation control.

FIG. 5 shows a block diagram of an exemplary embodiment of class AB/B amplifier activation control. Class AB/B amplifier 111 comprises class AB amplifier 301, controller or activation control 302 and class B amplifier 303. In this embodiment, activation control 302 comprises offset activation control 501 and bias activation control 502. Activation control 302 may be applied to one or more amplifiers despite this embodiment showing activation control is applied to class B amplifier 303. An offset may define or eliminate a portion of an input signal from amplification so that an amplifier amplifies less than all of an input signal. One or more offsets may limit the scope or range of signal amplification for a particular amplifier. Bias may prepare an amplifier for a transition, such as activation, deactivation, etc.

Offset activation control 501 comprises class AB replica stage 503, offset threshold generator 504 and offset activation signal generator 505. Class AB replica stage 503 comprises a replica of part or all of some aspect, characteristic (e.g. transconductance), feature, component, stage or signal in class AB amplifier 301 in order to replicate and thereby detect the operation of class AB amplifier 301. For example, the controller may be configured to replicate part or all of the first amplifier and use the replica to indicate operation of the first amplifier. The replica may be scaled in full (i.e. equal to), less than or greater than the replicated portion of the first amplifier. The replica permits detection of operation in parallel, i.e., concurrently or simultaneously, with the occurrence of the operation in the class AB amplifier. This ensures timing alignment of transitions in multiple amplified signals. If a transition in multiple amplifiers is based on the same signal and the same threshold then the transition threshold for multiple amplifiers is inherently aligned to ensure that the transitions in the multiple amplified signals occur at the same time.

Offset activation control 501, and specifically class AB replica stage 503, receives one or more signals directly or indirectly from class AB amplifier 301. A purpose for the one or more signals is to provide information about the operation of class AB amplifier 301 to activation control 303. As an example, in some embodiments, class AB amplifier 301 may comprise multiple stages, e.g. a first and second stage. A signal input to offset activation control 501 may comprise an output of the first stage of class AB amplifier 301.

In the embodiment shown in FIG. 5, the one or more signals are provided to class AB replica stage 503. If class AB replica stage 503 replicates the second stage of class AB amplifier 301, then the second stage of class AB amplifier 301 and the replicated second stage in class AB replica stage 503 receive the output of the first stage of class AB amplifier 301 and operate in parallel. The output of class AB replica stage 503, which indicates the real-time operation of class AB amplifier 301 in parallel with the occurrence of the operation, is provided to offset activation signal generator 505.

Offset threshold generator 504 generates an offset threshold that defines or eliminates a portion of input signal Vi from amplification so that class B amplifier 303 amplifies less than all of input signal Vi. For example, offset threshold generator 504 may generate one or more thresholds of operation (e.g. amplified current level, amplified voltage level) that class AB amplifier 301 must reach before class B amplifier 303 is activated and deactivated. Offset threshold generator 504 provides the offset threshold(s) to offset activation signal generator 505.

Offset activation signal generator 505 processes (e.g. compares, subtracts, adds) the indication of operation of class AB amplifier 301 received from class AB replica stage 503 and the offset threshold received from offset threshold generator 504 and outputs the result as offset activation control signal 506 to class B amplifier 303.

Bias activation control 502 comprises class AB replica stage 507, bias threshold generator 508 and bias activation signal generator 509. Class AB replica stage 507 may comprise the same replica as class AB replica stage 503, an additional replica or a different replica. In the present embodiment, each of class AB replica stages 503, 507 comprise a replica of a second stage of class AB amplifier 301 and a signal input to the replica comprises an output of the first stage of class AB amplifier 301. The output of class AB replica stage 507, which indicates the real-time operation of class AB amplifier 301 in parallel with the occurrence of the operation, is provided to bias activation signal generator 509.

Bias threshold generator 508 generates a bias threshold that prepares class B amplifier 303 for transition, e.g. activation, deactivation. For example, bias threshold generator 508 may generate one or more thresholds of operation (e.g. amplified current level, amplified voltage level) that class AB amplifier 301 must reach before bias is provided to class B amplifier 303 to prepare it for activation. The bias threshold may be lower than the activation or offset threshold in order to prepare class B amplifier 303 for activation or other transition. Bias threshold generator 508 provides the bias threshold(s) to bias activation signal generator 509.

Bias activation signal generator 509 processes (e.g. compares, subtracts, adds) the indication of operation of class AB amplifier 301 received from class AB replica stage 507 and the bias threshold received from bias threshold generator 508 and outputs the result as bias activation control signal 510 to class B amplifier 303.

Figure 6:
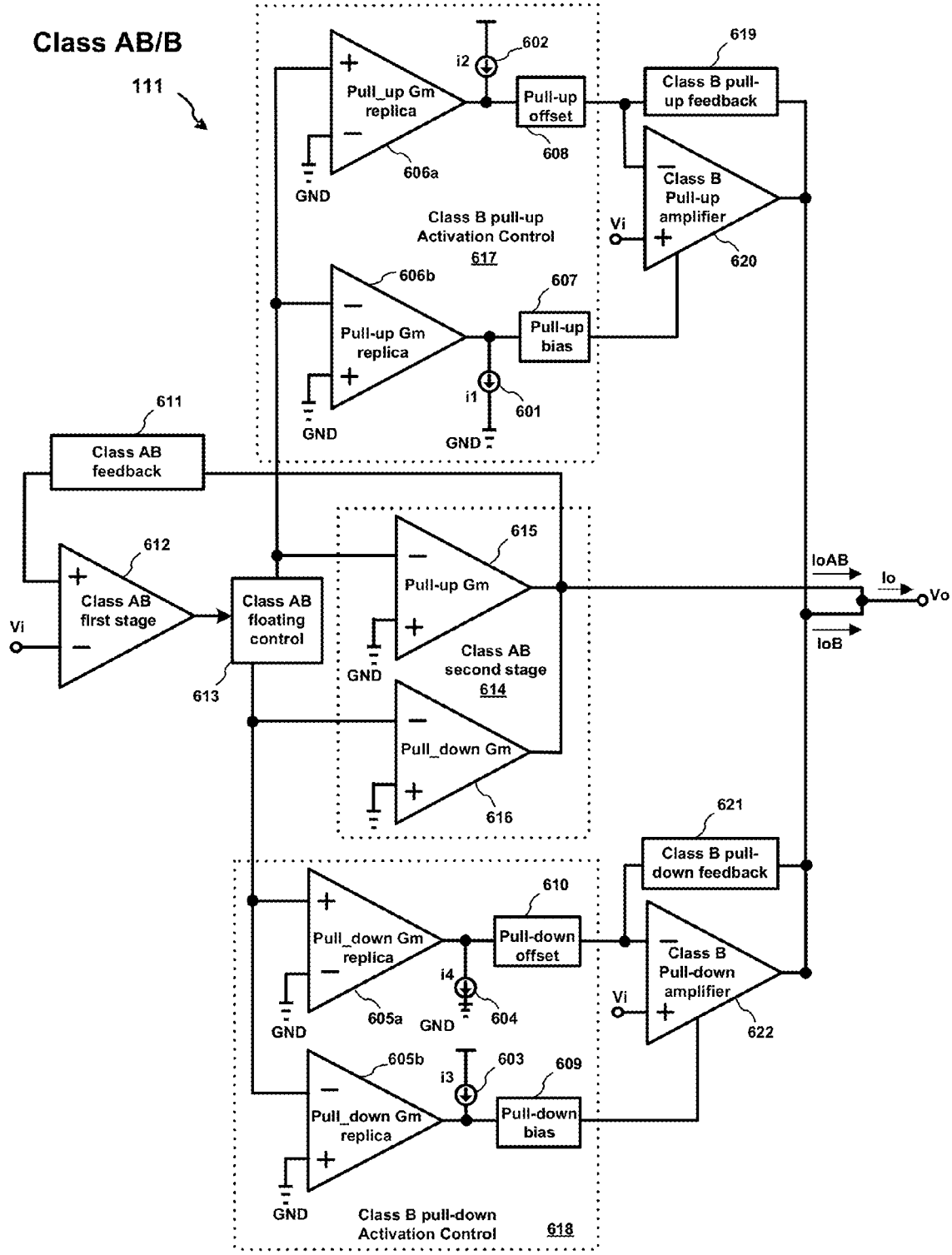
FIG. 6 shows a block diagram of an exemplary embodiment of a class AB/B amplifier and activation control.

FIG. 6 shows a block diagram of an exemplary embodiment of a class AB/B amplifier and activation control. FIG. 6 shows class AB/B amplifier 111 with pull-up and pull-down, i.e., push/pull, stages in class AB amplifier 301, class B amplifier 303 and activation control 302. In this embodiment, class AB amplifier 301 comprises class AB first stage 612, class AB feedback 611, class AB floating control 613 and class AB second stage 614. Class B amplifier 303 comprises class B pull-up amplifier 620, class B pull-up feedback 619, class B pull-down amplifier 622 and class B pull-down feedback 621. Activation control 302 comprises class B pull-up activation control 617 and class B pull-down activation control 618.

Class AB amplifier 301 comprises class AB first stage 612, class AB feedback 611, class AB floating control 613 and class AB second stage 614. These components create a loop, as shown in FIG. 6. Class AB first stage 612 may comprise an input stage of class AB amplifier 301. Class AB first stage 612 may provide a first stage of amplification of an input signal. Class AB first stage 612 receives input signal Vi at a negative input node. The positive input node of class AB first stage 612 is coupled to class AB feedback 611. Class AB first stage 612 generates an output, which is provided to class AB floating control 613. The output of class AB first stage 612 may also be provided directly to class AB second stage 614 and class B pull-up and pull-down activation control 617, 618.

Class AB floating control 613 provides quiescent current control in class AB amplifier 301. Class AB floating control 613 may be considered part of class AB first stage 612. Class AB floating control 613 may be implemented in a variety of ways. Some embodiments of class AB floating control 613 are described in detail in U.S. Pat. No. 7,304,538 to Jungwoo Song, filed Oct. 28, 2004, issued Dec. 4, 2007 and assigned to Broadcom Corporation, which is hereby incorporated by reference in its entirety as if fully set forth herein.

Class AB second stage 614 comprises pull-up gm (transconductance) 615 and pull-down gm 616. A positive input node or terminal of pull-up and pull-down gm 615, 616 is coupled to ground GND. A negative input node or terminal of pull-up and pull-down gm 615, 616 is coupled to an output of class AB first stage 612 or class AB floating control 613. Pull-up gm 615 and pull-down gm 616 may provide a second stage of amplification by generating a current in proportion to an input voltage. Output signals generated by each of pull-up gm 615 and pull-down gm 616 are coupled together and output as class AB output current IoAB. Pull-up gm 615 sources current to a load while pull-down gm 616 sinks current from the load, e.g., speaker 116, which is reflected in the polarity of class AB output current IoAB.

Class AB feedback 611 is coupled between the outputs of pull-up gm 615 and pull-down gm 616 and a positive input of class AB first stage 612, thereby forming a feedback loop between input and output stages of class AB amplifier 301. As previously noted, feedback gain provided by class AB feedback 611 and the overall gain transfer function of class AB amplifier 301 may be the same as feedback gain provided by class B amplifier feedbacks and the overall gain transfer function of class B amplifier 303.

Class B amplifier 303 comprises class B pull-up amplifier 620, class B pull-up feedback 619, class B pull-down amplifier 622 and class B pull-down feedback 621. Class B pull-up amplifier 620 may comprise one or more amplification stages. Class B pull-up amplifier 620 receives a pull-up bias signal from pull-up bias 607, a pull-up offset or activation signal from pull-up offset 608 coupled to a negative input node or terminal of class B pull-up amplifier 620 and input signal Vi coupled to a positive input node or terminal of class B pull-up amplifier 620. Class B pull-up amplifier 620 first receives bias before being activated. Class B pull-up amplifier 620 is deactivated before bias is removed. Class B pull-up amplifier 620 generates part of class B output current IoB. Specifically, class B pull-up amplifier 620 sources output current IoB to a load, e.g., speaker 116. Class B pull-up feedback 619 is coupled between the output and negative input node or terminal of class B pull-up amplifier 620. Feedback gain provided by class B pull-up feedback 619 and the overall gain transfer function of class B amplifier 303 may be the same as feedback gain provided by class AB feedback 611 and the overall gain transfer function of class AB amplifier 301.

Class B pull-down amplifier 622 may comprise one or more amplification stages. Class B pull-down amplifier 622 receives a pull-down bias signal from pull-down bias 609, a pull-down offset or activation signal from pull-down offset 610 coupled to a negative input node or terminal of class B pull-down amplifier 622 and input signal Vi coupled to a positive input node or terminal of class B pull-down amplifier 622. Class B pull-down amplifier 622 first receives bias before being activated. Class B pull-down amplifier 622 is deactivated before bias is removed. Class B pull-down amplifier 622 generates part of class B output current IoB. Specifically, class B pull-down amplifier 622 sinks output current IoB from a load, e.g., speaker 116. Class B pull-down feedback 621 is coupled between the output and negative input node or terminal of class B pull-down amplifier 622. Feedback gain provided by class B pull-down feedback 621 and the overall gain transfer function of class B amplifier 303 may be the same as feedback gain provided by class AB feedback 611 and the overall gain transfer function of class AB amplifier 301.

Activation control 302 comprises class B pull-up activation control 617 and class B pull-down activation control 618. Class B pull-up activation control 617 comprises pull-up gm replica 606a, 606b, current source 602, current source 601, pull-up offset 608 and pull-up bias 607.

Pull-up gm replica 606a comprises an inverse replica of pull-up gm 615. At its positive input node, pull-up gm replica 606a receives an output from class AB first stage 612 or class AB floating control 613. The negative input node of pull-up gm replica 606a is coupled to ground. The output of pull-up gm replica 606a is coupled to a node of current source 602. The other node of current source 602 is coupled to positive voltage supply VDD.

Current source 602 is a pull-up offset threshold generator. Current source 602 implements a pull-up offset threshold generator for offset threshold generator 504. Current source 602 generates current i2. In this embodiment, current i2 represents a class B pull-up offset threshold.

Pull-up offset 608 is coupled to the output nodes of pull-up gm replica 606a and current source 602. Pull-up offset 608 processes the output of pull-up gm replica 606a, which indicates operation of class AB amplifier 301, and class B pull-up offset threshold current i2. When the output current of pull-up gm replica 606a exceeds class B pull-up threshold current i2, pull-up offset 608 generates an offset or activation signal and provides it to the negative input node of class B pull-up amplifier 620.

Pull-up gm replica 606b comprises a replica of pull-up gm 615. At its negative input node, pull-up gm replica 606b receives an output from class AB first stage 612 or class AB floating control 613. The positive input node of pull-up gm replica 606b is coupled to ground. The output of pull-up gm replica 606b is coupled to a node of current source 601. The other node of current source 601 is coupled to ground GND.

Current source 601 is a pull-up bias threshold generator. Current source 601 implements a pull-up bias threshold generator for bias threshold generator 508. Current source 601 generates current i1. In this embodiment, current i1 represents a class B pull-up bias threshold.

Pull-up bias 607 is coupled to the output nodes of pull-up gm replica 606b and current source 601. Pull-up bias 607 processes the output of pull-up gm replica 606b, which indicates operation of class AB amplifier 301, and class B pull-up bias threshold current i1. When the output current of pull-up gm replica 606b exceeds class B pull-up bias threshold current i1, pull-up bias 607 generates a bias signal and provides it to bias class B pull-up amplifier 620.

Class B pull-down activation control 618 comprises pull-down gm replica 605a, 605b, current source 604, current source 603, pull-down offset 610 and pull-down bias 609.

Pull-down gm replica 605a comprises an inverse replica of pull-down gm 616. At its positive input node, pull-down gm replica 605a receives an output from class AB first stage 612 or class AB floating control 613. The negative input node of pull-down gm replica 605a is coupled to ground. The output of pull-down gm replica 605a is coupled to a node of current source 604. The other node of current source 604 is coupled to ground GND.

Current source 604 is a pull-down offset threshold generator. Current source 604 implements a pull-down offset threshold generator for offset threshold generator 504. Current source 604 generates current i4. In this embodiment, current i4 represents a class B pull-down offset threshold.

Pull-down offset 610 is coupled to the output nodes of pull-down gm replica 605a and current source 604. Pull-down offset 610 processes the output of pull-down gm replica 605a, which indicates operation of class AB amplifier 301, and class B pull-down offset threshold current i4. When the output current of pull-down gm replica 605a exceeds class B pull-down threshold current i4, pull-down offset 610 generates an offset or activation signal and provides it to the negative input node of class B pull-down amplifier 622.

Pull-down gm replica 605b comprises a replica of pull-down gm 616. At its negative input node, pull-down gm replica 605b receives an output from class AB first stage 612 or class AB floating control 613. The positive input node of pull-down gm replica 605b is coupled to ground. The output of pull-down gm replica 605b is coupled to a node of current source 603. The other node of current source 603 is coupled to positive voltage supply VDD.

Current source 603 is a pull-down bias threshold generator. Current source 603 implements a pull-down bias threshold generator for bias threshold generator 508. Current source 603 generates current i3. In this embodiment, current i3 represents a class B pull-down bias threshold.

Pull-down bias 609 is coupled to the output nodes of pull-down gm replica 605b and current source 603. Pull-down bias 609 processes the output of pull-down gm replica 605b, which indicates operation of class AB amplifier 301, and class B pull-down bias threshold current i3. When the output current of pull-down gm replica 605b exceeds class B pull-down bias threshold current i3, pull-down bias 609 generates a bias signal and provides it to bias class B pull-down amplifier 622.

Figure 7:
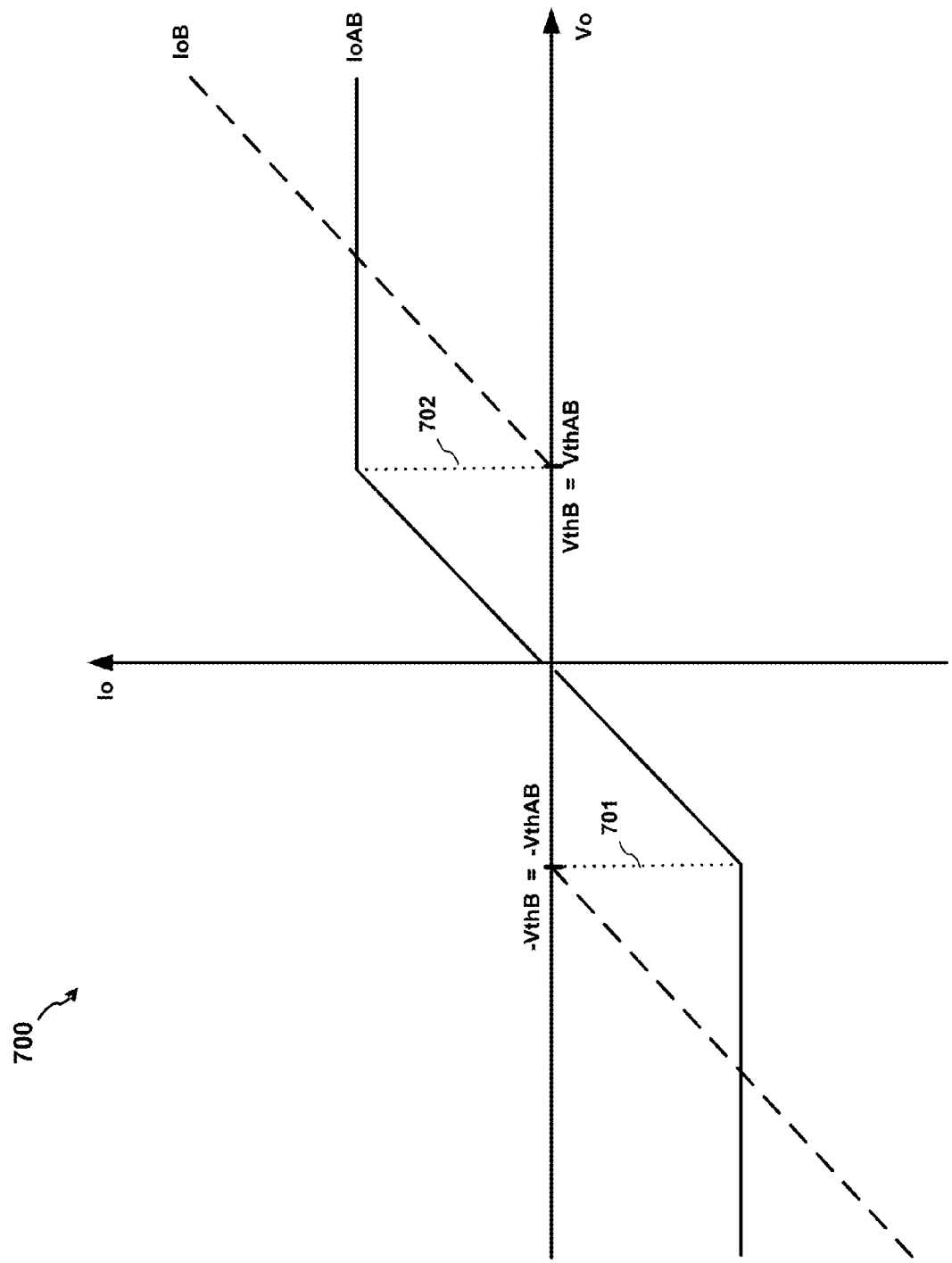
FIG. 7 shows exemplary performance of an embodiment of a class AB/B amplifier and activation control.

FIG. 7 shows exemplary performance of an embodiment of a class AB/B amplifier and activation control. FIG. 7 illustrates the individual and combined or unified output signals generated by embodiments of class AB amplifier 301, class B amplifier 303 and controller 302 for class AB/B amplifier 111. In FIG. 7, the y-axis represents output current Io and the x-axis represents output voltage Vo. Class AB amplifier 301 generates class AB output current IoAB while class B amplifier generates class B output current IoB.

As illustrated in FIG. 7, class AB offset or activation thresholds VthAB and −VthAB are essentially equivalent to or aligned with class B thresholds VthB and −VthAB. These thresholds are identified, respectively, as pull-down activation threshold 701 and pull-up activation threshold 702. Accordingly, transitions in operation of class AB amplifier 301 and class B amplifier 303 occur at essentially the same time. This time alignment occurs because only one offset or activation threshold and only one indication of operation of class AB amplifier 301 are utilized to determine when both amplifiers transition. Further, time alignment occurs because replication of class AB operation occurs in real-time with the operation of class AB amplifier 301.

FIG. 7 shows that when the magnitude (irrespective of polarity) of pull-down activation threshold 701 and pull-up activation threshold 702 are exceeded, the operation of class B amplifier 303 transitions by being activated from an inactive state and the operation of class AB amplifier 301 transitions by plateauing (e.g., becoming constant) in response to operation of class AB feedback 401 providing feedback of output signal Vo indicating amplification by class B amplifier 303. FIG. 7 shows that, following transitions in operation, as the magnitude (irrespective of polarity) of output voltage Vo increases, class B output current IoB contributes a larger portion of output current Io.

It may be observed from FIG. 7 that the portion of input signal Vi amplified by class AB amplifier 301 in this embodiment is the entirety of input signal Vi. It may also be observed that the portion of input signal Vi amplified by class B amplifier 303 in this embodiment is less than the entirety of input signal Vi. Class B amplifier 303 does not amplify input signal Vi between pull-up and pull-down offset thresholds VthB 702 and −VthB 701. Between these thresholds, class B amplifier 303 is inactive. However, the portions of input signal Vi amplified by class AB and B amplifiers 301, 303 do overlap. In other embodiments, amplifiers may amplify the same portions or different portions and those different portions may or may not overlap.

Figure 8:
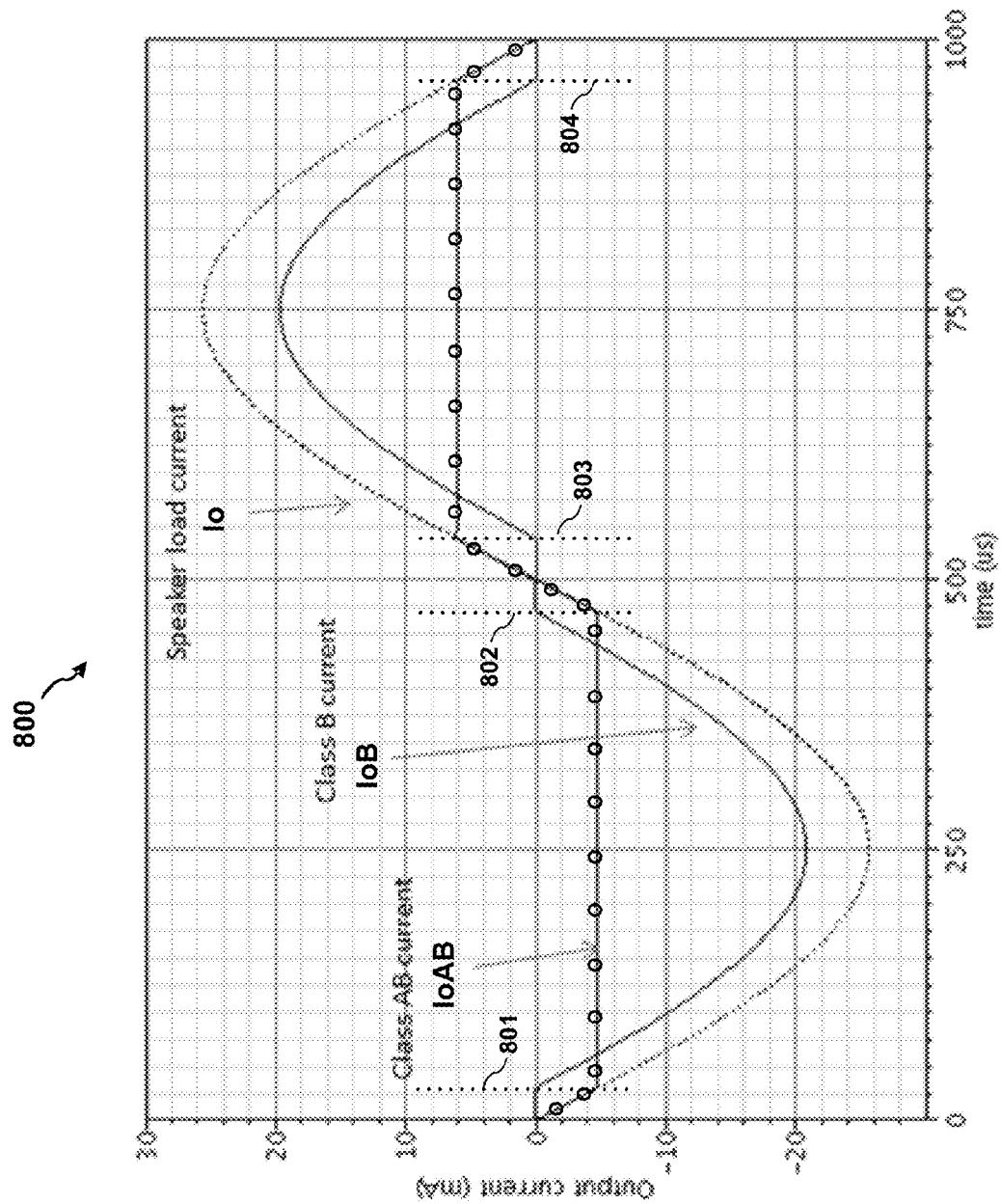
FIG. 8 shows exemplary performance of an embodiment of a class AB/B amplifier and activation control in response to a sinusoidal input.

FIG. 8 shows exemplary performance of an embodiment of a class AB/B amplifier and activation control in response to a sinusoidal input. FIG. 8 illustrates the individual and combined or unified output signals generated by embodiments of class AB amplifier 301, class B amplifier 303 and controller 302 for class AB/B amplifier 111 in response to a 1 kHz sinusoidal input. In FIG. 8, the y-axis represents output current Io in milliamps and the x-axis represents time in microseconds. Class AB amplifier 301 generates class AB output current IoAB while class B amplifier generates class B output current IoB. The combined or unified output signal generated by class AB/B amplifier 111 is output current Io.

FIG. 8 shows that transition thresholds for class AB amplifier 301 and class B amplifier 303 are essentially the same or aligned. Accordingly, transitions in operation of class AB amplifier 301 and class B amplifier 303 occur at essentially the same time. At the first transition 801, class AB amplifier 301 transitions from increasing negative current to constant negative current while class B amplifier 303 transitions from zero current to increasing negative current. At the second transition 802, class AB amplifier 301 transitions from constant negative current to decreasing negative current. while class B amplifier 303 transitions from decreasing negative current to zero current. At the third transition 803, class AB amplifier 301 transitions from increasing positive current to constant positive currentwhile class B amplifier 303 transitions from zero current to increasing positive current. At the fourth transition 804, class AB amplifier 301 transitions constant positive current to decreasing positive current while class B amplifier 303 transitions from decreasing positive current to zero current.

Combining waveforms of class AB and class B output current yields the sinusoidal waveform of class AB/B amplifier 111 output current Io. This waveform demonstrates how class AB and B amplifiers 301, 303 are operated together, synergistically, to perform as one amplifier. This waveform also demonstrates why proper alignment of transition thresholds (e.g. timing alignment) and amplified signals (e.g. transfer function alignment) is important to avoid non-linear or abrupt distortions in the unified amplified output signal, e.g. output current Io.

Like FIG. 7, FIG. 8 shows that the portion of input signal Vi amplified by class AB amplifier 301 is the entirety of input signal Vi while the portion of input signal Vi amplified by class B amplifier 303 is less than the entirety of input signal Vi. The portions of input signal Vi amplified by class AB and B amplifiers 301, 303 overlap. In other embodiments, amplifiers may amplify the same portions or different portions and those different portions may or may not overlap.

Figure 9:
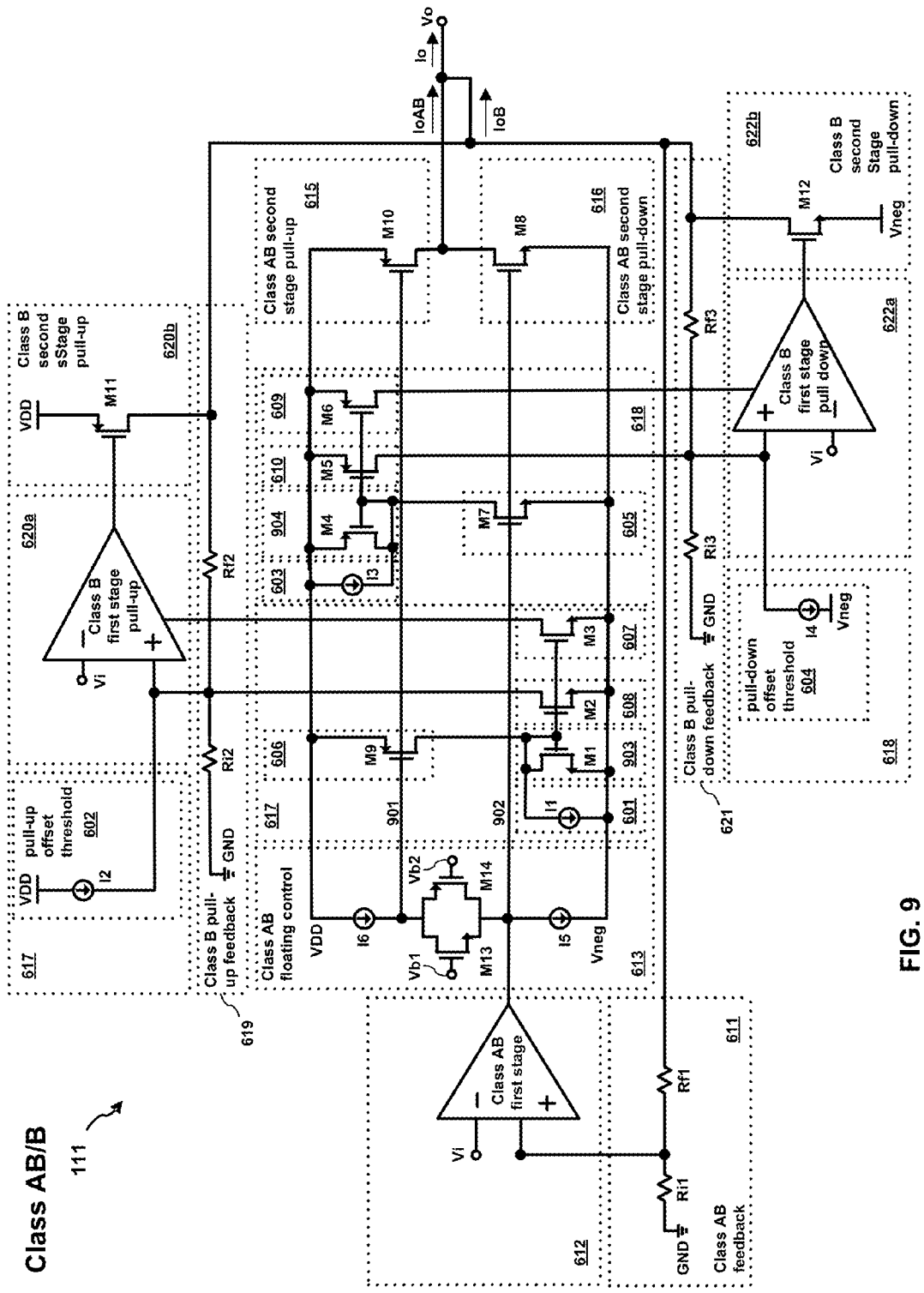
FIG. 9 shows an exemplary embodiment of a class AB/B amplifier and activation control circuit.

FIGS. 9 shows an exemplary embodiment of a class AB/B amplifier and activation control circuit. FIG. 9 shows a transistor-level implementation of class AB/B amplifier 111. Class AB/B amplifier 111 comprises class AB first stage 612, class AB second stage pull-up 615, class AB second stage pull-down 616, class AB feedback 611, class AB floating control 613, class B pull-up first stage 620a, class B pull-up second stage 620b, class B pull-up feedback 619, class B pull-down first stage 622a, class B pull-down second stage 622b, class B pull-down feedback 621, class B pull-up activation control 617 including pull-up offset threshold 602 and class B pull-down activation control 618 including pull-down offset threshold 604.

Class AB first stage 612 is substantially as shown in FIG. 6, with negative input node coupled to input signal Vi, positive input node coupled to class AB feedback 611 and output coupled to class AB floating control 613.

Class AB second stage pull-up 615 comprises pull-up transistor M10. Class AB second stage pull-up 615 is an implementation of pull-up gm (transconductor) in FIG. 6. Pull-up transistor M10 is a PMOS transistor with its source node coupled to positive voltage supple VDD and its drain node supplying output signal Vo. Pull-up transistor M10 is controlled at its gate node by pull-up bias 901 generated by class AB floating control 613. Pull-up transistor M10 operates as a driver stage to source class AB output current IoAB.

Class AB second stage pull-down 616 comprises pull-down transistor M8. Class AB second stage pull-down 616 is an implementation of pull-down gm (transconductor) in FIG. 6. Pull-down transistor M8 is an NMOS transistor with its source node coupled to negative voltage supple Vneg and its drain node supplying output signal Vo. Pull-down transistor M8 is controlled at its gate node by pull-down bias 902 generated by class AB floating control 613. Pull-down transistor M8 operates as a driver stage to sink class AB output current IoAB.

Class AB feedback 611 comprises first input resistor Ri1 and first feedback resistor Rf1. A first node of first input resistor Ri1 is coupled to ground GND and a second node of first input resistor Ri1 is coupled to the positive input node of class AB first stage amplifier 612 and to a first node of first feedback resistor Rf1. A second node of first feedback resistor Rf1 is coupled to the output, including the drain nodes of pull-up transistor M10 and pull-down transistor M8, thereby providing a feedback loop for class AB amplifier 111.

Class AB floating control 613 comprises first bias control transistor M13, second bias control transistor M14, fifth current source i5 and sixth current source i6. Class AB floating control 613 is used to bias the Class AB second stage comprising M8 and M10. Class AB floating control 613 provides quiescent current control in class AB amplifier 301. Class AB floating control 613 may be considered part of class AB first stage 612.

First bias control transistor M13 comprises an NMOS transistor. Its source node is coupled to the drain node of second bias control transistor M14, the output of class AB first stage 612, a first node of fifth current source i5 and to the gate nodes of pull-down replica transistor M7 and pull-down transistor M8. Its drain node is coupled to the source node of second bias control transistor M14, a first node of sixth current source i6 and to the gate nodes of pull-up replica transistor M9 and pull-up transistor M10. Its gate is controlled by first bias voltage VB1. A second node of fifth current source i5 is coupled to negative voltage supply Vneg. A second node of sixth current source i6 is coupled to positive voltage supply VDD.

Second bias control transistor M14 comprises a PMOS transistor. Its drain node is coupled to the source node of first bias control transistor M13, the output of class AB first stage 612, a first node of fifth current source i5 and to the gate nodes of pull-down replica transistor M7 and pull-down transistor M8. Its source node is coupled to the drain node of first bias control transistor M13, a first node of sixth current source i6 and to the gate nodes of pull-up replica transistor M9 and pull-up transistor M10. Its gate is controlled by second bias voltage VB2.

Bias control may be configured differently in other embodiments, including as described in U.S. Pat. No. 7,304,538 incorporated by reference herein. As one additional example, the two current sources, i.e., i5 and i6, in the present embodiment may be implemented as current mirrors in class AB first stage 612. First and second bias control transistors M13, M14 could be implemented with a current source and cascade device and a cascaded current mirror that are all part of the first stage of ClassAB amplifier 301. There is one input and two outputs, although still single-ended outputs, to this embodiment of a floating Class AB control circuit. This embodiment could be considered to be incorporated into ClassAB first stage amplifier 612.

Class B first stage pull-up 620a comprises class B first stage pull-up amplifier. Class B first stage pull-up 620a is an implementation of a first stage of class B pull-up amplifier 620 in FIG. 6. Class B first stage pull-up 620a has its negative input node coupled to input signal Vi, its positive input signal coupled to class B pull-up feedback 619, to a first node of second current source i2 and to a drain node of pull-up offset transistor M2, and its output node coupled to a gate node of class B second stage pull-up transistor M11.

Class B second stage pull-up 620b comprises class B pull-up transistor M11. Class B pull-up transistor M11 is an implementation of a second stage of class B pull-up amplifier 620 in FIG. 6. Class B pull-up transistor M11 is a PMOS transistor with its source node coupled to positive voltage supple VDD and its drain node supplying output signal Vo. Class B pull-up transistor M11 is controlled at its gate node by the output of class B first stage pull-up amplifier 620a. Class B pull-up transistor M11 operates as a driver stage to source class B output current IoB.

Class B pull-up feedback 619 comprises second input resistor Ri2 and second feedback resistor Rf2. A first node of second input resistor Ri2 is coupled to ground GND and a second node of second input resistor Ri2 is coupled to the positive input node of class B first stage pull-up amplifier 620a and to a first node of second feedback resistor Rf2. A second node of second feedback resistor Rf2 is coupled to the output, including the drain node of class B pull-up transistor M11, thereby providing a feedback loop for class B pull-up amplifier 620.

Class B first stage pull-down 622a comprises class B first stage pull-down amplifier. Class B first stage pull-down 622a is an implementation of a first stage of class B pull-down amplifier 622 in FIG. 6. Class B first stage pull-down 622a has its negative input node coupled to input signal Vi, its positive input signal coupled to class B pull-down feedback 621, to a first node of fourth current source i4 and to a drain node of pull-down offset transistor M5, and its output node coupled to a gate node of class B second stage pull-down transistor M12.

Class B second stage pull-down 622b comprises class B pull-down transistor M12. Class B pull-down transistor M12 is an implementation of a second stage of class B pull-down amplifier 622 in FIG. 6. Class B pull-down transistor M12 is an NMOS transistor with its source node coupled to negative voltage supple Vneg and its drain node supplying output signal Vo. Class B pull-down transistor M12 is controlled at its gate node by the output of class B first stage pull-down amplifier 622a. Class B pull-down transistor M12 operates as a driver stage to sink class B output current IoB.

Class B pull-down feedback 621 comprises third input resistor Ri3 and third feedback resistor Rf3. A first node of third input resistor Ri3 is coupled to ground GND and a second node of third input resistor Ri3 is coupled to the positive input node of class B first stage pull-down amplifier 622a and to a first node of third feedback resistor Rf3. A second node of third feedback resistor Rf3 is coupled to the output, including the drain node of class B pull-down transistor M12, thereby providing a feedback loop for class B pull-down amplifier 622.

Feedback design may vary between embodiments. Although the values of first input resistor Ri1 and first feedback resistor Rf1, second input resistor Ri2 and second feedback resistor Rf2, and third input resistor Ri3 and third feedback resistor Rf3 may not need to be the same, their values may be designed to provide essentially the same feedback gain and/or provide essentially the same gain transfer function for their respective amplifiers for purposes of amplified signal transition alignment when operating the plurality of amplifiers synergistically as one amplifier. Alternative feedback designs may be implemented in many possible embodiments.

Class B pull-up activation control 617 comprises pull-up gm replica 606, pull-up current mirror element 903, pull-up bias threshold or first current source 601, pull-up offset threshold or second current source 602, pull-up bias 607 and pull-up offset 608.

Pull-up bias threshold or first current source 601 generates pull-up bias threshold current i1. Pull-up offset threshold or second current source 602 generates pull-up offset threshold current i2. These two thresholds are set so that biasing occurs before activation and deactivation or other transitions in operation of class B pull-up amplifier 620.

Pull-up gm replica 606 comprises pull-up replica transistor M9. Pull-up replica transistor M9 is a PMOS transistor with its source node coupled to positive voltage supply VDD, its drain node coupled to current mirror element 903 and its gate coupled to pull-up bias 901 from class AB floating control 613. Pull-up replica transistor M9 is a replica of class AB second stage pull-up transistor M10. Pull-up replica transistor M9 may be a scaled or full-size replica. Pull-up replica transistor M9 receives the same input as pull-up transistor M10 to replicate the operation of class AB amplifier 301 in real-time.

Pull-up current mirror element 903 comprises pull-up current mirror transistor M1. Pull-up current mirror transistor M1 comprises an NMOS transistor with its source node coupled to negative voltage supply Vneg, its gate and drain nodes coupled together to a drain node of pull-up replica transistor M9 and a first node of pull-up bias threshold or first current source 601. Current flows through pull-up current mirror transistor M1 when current through pull-up replica transistor M9 exceeds pull-up bias threshold current i1. The current flowing through pull-up current mirror transistor M1 is mirrored in pull-up offset transistor M2 and pull-up bias transistor M3.

Pull-up bias 607 comprises pull-up bias transistor M3. Pull-up bias transistor M3 comprises an NMOS transistor with its source node coupled to negative voltage supply Vneg, its drain node coupled to bias class B first stage pull-up amplifier 620a, and its gate node coupled to gate and drain nodes of pull-up current mirror transistor M1, to drain node of pull-up replica transistor M9 and to a first node of pull-up bias threshold or first current source 601. Current flows through pull-up current mirror transistor M1 when current through pull-up replica transistor M9 exceeds pull-up bias threshold current i1. The current flowing through pull-up current mirror transistor M1 is mirrored in pull-up bias transistor M3. Current flowing through pull-up bias transistor M3 provides bias to first stage pull-up amplifier 620a. This bias prepares first stage pull-up amplifier 620a for activation or maintains proper operation of first stage pull-up amplifier 620a until deactivation.

Pull-up offset 608 comprises pull-up offset transistor M2. Pull-up offset transistor M2 comprises an NMOS transistor with its source node coupled to negative voltage supply Vneg. The drain node of pull-up offset transistor M2 is coupled to a positive input of class B first stage pull-up amplifier 620a. The drain node of pull-up offset transistor M2 is also coupled to a first node of pull-up offset threshold or second current source 602. The gate node of pull-up offset transistor M2 is coupled to gate and drain nodes of pull-up current mirror transistor M1, to drain node of pull-up replica transistor M9 and to a first node of pull-up bias threshold or first current source 601.

Current flows through pull-up current mirror transistor M1 when current through pull-up replica transistor M9 exceeds pull-up bias threshold current i1. The current flowing through pull-up current mirror transistor M1 is mirrored in pull-up offset transistor M2. Class B first stage pull-up amplifier 620a is not activated until current flowing through pull-up offset transistor M2 exceeds pull-up offset threshold current i2, which occurs after pull-up bias transistor M3 provides bias to first stage pull-up amplifier 620a. Similarly, Class B first stage pull-up amplifier 620a will be deactivated first before bias is removed because current flowing through pull-up offset transistor M2 will fall below pull-up offset threshold current i2 before current flowing through pull-up bias transistor M3 falls below pull-up bias threshold current i1.

Class B pull-down activation control 618 comprises pull-down gm replica 605, pull-down current mirror element 904, pull-down bias threshold or third current source 603, pull-down offset threshold or fourth current source 604, pull-down bias 609 and pull-down offset 610.

Pull-down bias threshold or third current source 603 generates pull-up bias threshold current i3. Pull-down offset threshold or fourth current source 604 generates pull-up offset threshold current i4. These two thresholds are set so that biasing occurs before activation and deactivation or other transitions in operation of class B pull-down amplifier 622.

Pull-down gm replica 605 comprises pull-down replica transistor M7. Pull-down replica transistor M7 is an NMOS transistor with its source node coupled to negative voltage supply Vneg, its drain node coupled to current mirror element 904 and its gate coupled to pull-down bias 902 from class AB floating control 613. Pull-down replica transistor M7 is a replica of class AB second stage pull-down transistor M8. Pull-down replica transistor M7 may be a scaled or full-size replica. Pull-down replica transistor M7 receives the same input as pull-down transistor M8 to replicate the operation of class AB amplifier 301 in real-time.

Pull-down current mirror element 904 comprises pull-down current mirror transistor M4. Pull-down current mirror transistor M4 comprises a PMOS transistor with its source node coupled to positive voltage supply VDD, its gate and drain nodes coupled together to a drain node of pull-down replica transistor M7 and a first node of pull-down bias threshold or third current source 603. Current flows through pull-down current mirror transistor M4 when current through pull-down replica transistor M7 exceeds pull-down bias threshold current i3. The current flowing through pull-down current mirror transistor M4 is mirrored in pull-down offset transistor M5 and pull-down bias transistor M6.

Pull-down bias 609 comprises pull-down bias transistor M6. Pull-down bias transistor M6 comprises a PMOS transistor with its source node coupled to positive voltage supply VDD, its drain node coupled to bias class B first stage pull-down amplifier 622a, and its gate node coupled to gate and drain nodes of pull-down current mirror transistor M4, to drain node of pull-down replica transistor M7 and to a first node of pull-down bias threshold or third current source 603. Current flows through pull-down current mirror transistor M4 when current through pull-down replica transistor M7 exceeds pull-down bias threshold current i3. The current flowing through pull-down current mirror transistor M4 is mirrored in pull-down bias transistor M6. Current flowing through pull-down bias transistor M6 provides bias to first stage pull-down amplifier 622a. This bias prepares first stage pull-down amplifier 622a for activation or maintains proper operation of first stage pull-down amplifier 622a until deactivation.

Pull-down offset 610 comprises pull-down offset transistor M5. Pull-down offset transistor M5 comprises a PMOS transistor with its source node coupled to positive voltage supply VDD. The drain node of pull-down offset transistor M5 is coupled to a positive input of class B first stage pull-down amplifier 622a. The drain node of pull-down offset transistor M5 is also coupled to a first node of pull-down offset threshold or fourth current source 604. The gate node of pull-down offset transistor M5 is coupled to gate and drain nodes of pull-down current mirror transistor M4, to drain node of pull-down replica transistor M7 and to a first node of pull-down bias threshold or third current source 603.

Current flows through pull-down current mirror transistor M4 when current through pull-down replica transistor M7 exceeds pull-down bias threshold current i3. The current flowing through pull-down current mirror transistor M4 is mirrored in pull-down offset transistor M5. Class B first stage pull-down amplifier 622a is not activated until current flowing through pull-down offset transistor M5 exceeds pull-down offset threshold current i4, which occurs after pull-down bias transistor M6 provides bias to first stage pull-down amplifier 622a. Similarly, Class B first stage pull-down amplifier 622a will be deactivated before bias is removed because current flowing through pull-down offset transistor M5 will fall below pull-down offset threshold current i4 before current flowing through pull-down bias transistor M6 falls below pull-down bias threshold current i3.

The overall operation of class B pull-up amplifier 620 and class B pull-down amplifier 622 should now be clear. Current flows through class B second stage pull-up transistor M11 as class B output current IoB, and is sourced to a load as class AB/B output current Io, when current mirrored in pull-up offset transistor M2 exceeds pull-up current threshold i2. Current flows through class B second stage pull-down transistor M12 as class B output current IoB, and is sinked from a load as class AB/B output current Io, when current mirrored in pull-down offset transistor M5 exceeds pull-down current threshold i4.

Figure 10:
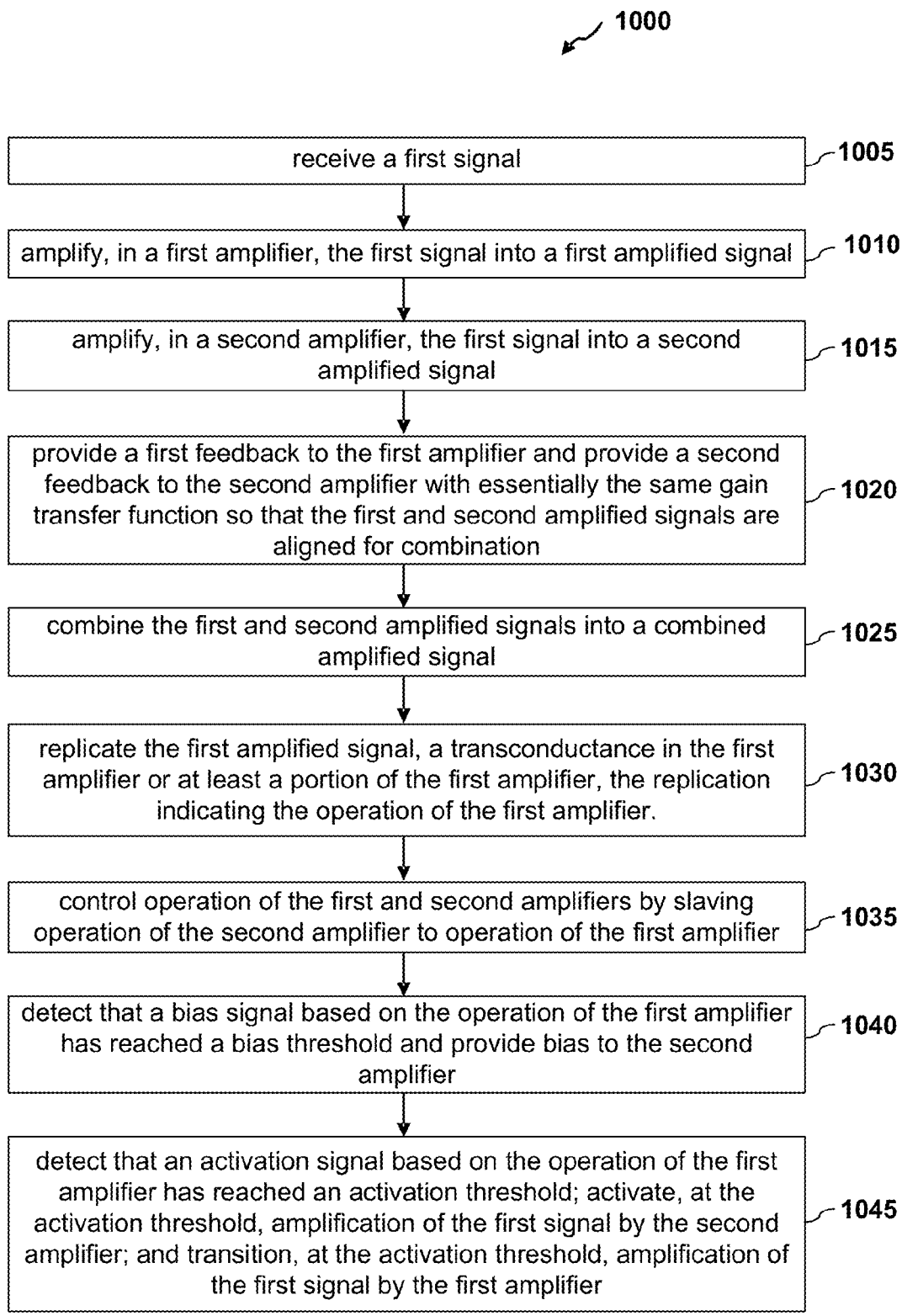
FIG. 10 shows an exemplary embodiment of a method of operating an embodiment of a class AB/B amplifier and activation control.

Embodiments may also be implemented in processes or methods. For example, FIG. 10 shows an exemplary embodiment of a method of operating an embodiment of a class AB/B amplifier and activation control. Class AB/B amplifier 111 and other embodiments may operate according to method 1000. Method 1000 comprises steps 1005 to 1045. However, other embodiments may operate according to other methods. Other structural and operational embodiments will be apparent to persons skilled in the relevant arts) based on the foregoing discussion of embodiments. No order of steps is required unless expressly indicated or inherently required. There is no requirement that a method embodiment implement all of the steps illustrated in FIG. 10. FIG. 10 is simply one of many possible embodiments. Embodiments may implement fewer, more or different steps.

Method 1000 begins with step 1005. In step 1005, a first signal is received. For example, as shown in FIG. 9, a first signal, e.g., Vi, is received at class AB first stage amplifier 612, at class B first stage pull-up amplifier 620a and at class B first stage pull-down amplifier 622a.

At step 1010, the first signal is amplified, in a first amplifier, into a first amplified signal. For example, as shown in FIG. 3, the first signal Vi is amplified by first amplifier, e.g., class AB amplifier 301, into a first amplified signal, e.g., class AB output current IoAB.

At step 1015, the first signal is amplified, in a second amplifier, into a second amplified signal. For example, as shown in FIG. 3, the first signal Vi is amplified by second amplifier, e.g., class B amplifier 303, into a second amplified signal, e.g., class B output current IoB.

At step 1020, a first feedback is provided to the first amplifier and a second feedback is provided to the second amplifier with essentially the same gain transfer function so that the first and second amplified signals are aligned for combination. For example, as shown in FIG. 4, a first feedback, e.g., class AB feedback 401 is provided to first amplifier, e.g., class AB amplifier 301, and a second feedback, e.g., class B feedback 403 is provided to second amplifier, e.g., class B amplifier 303. First feedback may comprise, for example, class AB feedback 611 shown in FIG. 9. Second feedback may comprise, for example, class B pull-up feedback 619 and class B pull-down feedback 621 shown in FIG. 9. First and second feedbacks may be designed to provide their respective amplifiers with gain feedback so that each amplifier has essentially the same gain transfer function. As a result of transfer function alignment, class AB and class B amplified output signals may be proportionally aligned during transitions.

At step 1025, the first and second amplified signals are combined into a combined amplified signal. For example, as shown in FIG. 9, first amplified signal, e.g., class AB output current IoAB, is combined with second amplified signal, e.g., class B output current IoB, into a combined or unified amplified signal, i.e., class AB/B output current Io.

At step 1030, the first amplified signal, a transconductance in the first amplifier or at least a portion of the first amplifier is replicated, the replication indicating the operation of the first amplifier. For example, as shown in FIG. 9, pull-up replica transistor M9 replicates class AB second stage pull-up transistor M10, which is a portion of class AB amplifier 301, and pull-down replica transistor M7 replicates class AB second stage pull-down transistor M8, which is a portion of class AB amplifier 301. Class AB second stage pull-up transistor M10 and class AB second stage pull-down transistor M8 are transconductors. Current flowing through pull-up replica M9 replicates current, e.g. first amplified signal IoAB, flowing through class AB second stage pull-up transistor M10. Current flowing through pull-down replica M7 replicates current, e.g. first amplified signal IoAB, flowing through class AB second stage pull-down transistor M8. These replicas replicate the first amplified signal, a transconductance in the first amplifier or at least a portion of the first amplifier. These replicas may be scaled to any size, including full-size, in various embodiments. Regardless of scale, these replicas indicate the operation of the first amplifier, e.g., class AB amplifier 301.

At step 1035, operation of the first and second amplifiers is controlled by slaving operation of the second amplifier to operation of the first amplifier. For example, as shown in FIG. 9, class B pull-up and pull-down activation control 617, 618 control operation of second amplifier, e.g., class B pull-up first and second stages 620a, 620b and class B pull-down first and second stages 622a, 622b based on operation of first amplifier, e.g., class AB first stage 612 and second stage pull-up and pull-down 615, 616. Although class AB amplifier 301 and class B amplifier 303 operate independently to amplify the same input signal Vi, the state of operation of class B amplifier 303 is dependent upon operation of class AB amplifier 301. In this sense, class B amplifier 303 is slaved to operation of class AB amplifier 303.

At step 1040, it is detected that a bias signal based on the operation of the first amplifier has reached a bias threshold and bias is provided to the second amplifier. For example, as shown in FIG. 9, current flows through pull-up current mirror transistor M1 when current through pull-up replica transistor M9 exceeds pull-up bias threshold current i1. Current through pull-up replica transistor M9 is based on operation of first amplifier, e.g., class AB amplifier 301. The current flowing through pull-up current mirror transistor M1 is mirrored in pull-up bias transistor M3. Current flowing through pull-up bias transistor M3 provides bias to first stage pull-up amplifier 620a. Similarly, current flows through pull-down current mirror transistor M4 when current through pull-down replica transistor M7 exceeds pull-down bias threshold current i3. Current through pull-down replica transistor M7 is based on operation of first amplifier, e.g., class AB amplifier 301. The current flowing through pull-down current mirror transistor M4 is mirrored in pull-down bias transistor M6. Current flowing through pull-down bias transistor M6 provides bias to first stage pull-down amplifier 622a.

At step 1045, it is detected that an activation signal based on the operation of the first amplifier has reached an activation threshold; amplification of the first signal is activated, at the activation threshold, by the second amplifier; and amplification of the first signal transitions, at the activation threshold, within the first amplifier. For example, as shown in FIG. 9, current flows through pull-up current mirror transistor M1 when current through pull-up replica transistor M9 exceeds pull-up bias threshold current i1. Current through pull-up replica transistor M9 is based on operation of first amplifier, e.g., class AB amplifier 301. The current flowing through pull-up current mirror transistor M1 is mirrored in pull-up offset transistor M2. Class B first stage pull-up amplifier 620a is not activated until current flowing through pull-up offset transistor M2 exceeds pull-up offset (e.g. activation) threshold current i2.

Similarly, as shown in FIG. 9, current flows through pull-down current mirror transistor M4 when current through pull-down replica transistor M7 exceeds pull-down bias threshold current i3. Current through pull-down replica transistor M7 is based on operation of first amplifier, e.g., class AB amplifier 301. The current flowing through pull-down current mirror transistor M4 is mirrored in pull-down offset transistor M5. Class B first stage pull-down amplifier 622a is not activated until current flowing through pull-down offset transistor M5 exceeds pull-down offset (e.g. activation) threshold current i4.

As shown in FIG. 7, at the activation threshold 702, amplification of the first signal (class B output signal IoB) by the second amplifier (class B amplifier 303) is activated and amplification of the second signal (class AB output current signal IoAB) by the first amplifier (class AB amplifier 301) is transitioned by operation of the feedback within class AB/B amplifier 111.

As shown in FIG. 6, Class AB feedback 611, Class B pull-up feedback 619 and Class B pull-down feedback 621 are all connected to the same output voltage signal, Vo. The relationship between output voltage signal, Vo, and output current signal, Io, is an "Ohm's law" relationship V=I*R, where R is the resistance of a load that class AB/B amplifier 111 drives at its output. Output current signal Io is the sum of class B output signal IoB and Class AB output current IoAB.

Class AB/B amplifier 111 in FIG. 6 operates with three closed-loop feedback circuits. All three closed-loop feedback circuits are connected to the single output terminal that they share in common at the output, Vo. The first of these closed-loop feedback circuits is formed with Class AB feedback 611, Class AB first stage 612 and Class AB second stage 614. This closed-loop feedback circuit provides class AB output current IoAB. This is an embodiment of the first amplifier 301 in FIG. 3. The second of these closed-loop feedback circuits is a pull-up circuit formed with Class B pull-up feedback 619 and Class B pull-up amplifier 620. The third of these closed-loop feedback circuits is a Class B pull-down circuit formed with Class B pull-down feedback 621 and Class B pull-down amplifier 622. The second and third closed-loop feedback circuits work together to provide Class B output signal IoB. The Class B pull-up circuit sources current to the output load when the output current, Io, is positive and the Class B pull-down circuit sinks current to the load when Io is negative. The second and third closed-loop feedback circuits together are an embodiment of the second amplifier, e.g., class B amplifier 303 in FIG. 3.

The three closed-loop feedback circuits in this embodiment each utilize feedback gain to achieve an accurate relationship between input terminal Vi and output terminal Vo. The relationship between Vi and Vo in each of the three feedback loop circuits is determined by the feedback gains of Class AB feedback 611, Class B pull-up feedback 619 and Class B pull-down feedback 621. The same nominal value of feedback gain in each of the three feedback loop circuits ensures the same accurate relationship between Vi and Vo in all three of these circuits. The result of the configuration of these three closed-loop feedback circuits together with the same nominal values of feedback gain in each of these circuits is that activation of the second amplifier, e.g., class B amplifier 303 in FIG. 3, causes Vo to transition with the desired relationship to Vi without additional class AB output current IoAB, flowing from the first amplifier, e.g., class AB amplifier 301. This configuration, i.e., the three closed-loop feedback circuits having the same gain, establishes the operation of feedback within class AB/B amplifier 111. This feedback operation guarantees that additional class AB output current IoAB is not required by the first amplifier (class AB amplifier 301) in class AB/B amplifier 111 when the second amplifier (class B amplifier 303) is activated. Due to the operation of the feedback within class AB/B amplifier 111, the amplification of the Class AB output current signal IoAB by class AB amplifier 301 transitions when the second amplifier is activated, such that output current signal IoAB of Class AB amplifier 301 does not continue increasing or decreasing at the same rate when the second amplifier is activated.

Alternative embodiments could make use of many other approaches to cause the amplification of Vi into output current signal IoAB by the first amplifier to transition when the second amplifier is activated. In one such alternative embodiment the activation could be applied to cause a modification of the operation of the first amplifier when the activation signal reaches the activation threshold. For example, the gain of the first amplifier could be modified, the bandwidth of the first amplifier could be modified, the feedback circuit of the first amplifier could be modified, an offset current or an offset voltage could be programmed to change in the first amplifier, or a supply voltage could be programmed to change in the first amplifier. These alternatives, among others, that change the approach or technique to cause amplification of the input signal in the first amplifier to transition, could be implemented within the spirit and scope of the subject matter disclosed herein.

Alternative embodiments could make use of many other approaches to activate amplification of Vi into output current signal IoB by the second amplifier. In some alternative embodiments, activation of the second amplifier could be established in response to: a voltage level in the first amplifier exceeding a threshold voltage, a voltage level at the output of the amplifier exceeding a threshold voltage, a current at the output exceeding a threshold current, a voltage across a resistor connected in series with the load exceeding a threshold voltage, etc. These alternative embodiments, among other embodiments, to define a threshold for activation of the second amplifier could be implemented within the spirit and scope of the subject matter disclosed herein.

In other alternative embodiments, activation of the second amplifier could make use of many other approaches besides or in addition to bias activation and offset activation to activate the second amplifier. For example, the gain or bandwidth of the second amplifier could be programmed to change in response to the activation signal, the feedback circuit of the first amplifier could be modified in response to the activation signal, the supply voltage of the second amplifier could be programmed to change in response to the activation signal, etc. These alternatives, among others, to activate the second amplifier could be implemented within the spirit and scope of the subject matter disclosed herein.

Alternative embodiments could make use of many other feedback structures in the first and second amplifiers. For example, voltage-mode feedback in the three closed-loop feedback circuits shown in FIG. 6 could be changed from non-inverting amplifier structures shown in FIG. 6 to inverting amplifier structures, voltage-mode feedback could be replaced with current-mode feedback, passive feedback networks could be replaced with active feedback networks, and feedback networks could be implemented with many different types of amplification structures to generate the feedback signals. These alternatives, among others, to feedback structure could be implemented within the spirit and scope of the subject matter disclosed herein.

Alternative embodiments could make use of a variety of alternative amplifier structures and alternative amplifier feedback networks to support differential inputs and outputs or to provide single-ended inputs. For example, amplifier structure could be modified to have a differential output structure and drive a differential load rather than the single-ended output structure shown in FIGS. 1, 3, 4, 6 and 9. Such a differential output structure could be obtained, for example, by implementing a differential output stage in each of the first and second amplifiers, while implementing a common-mode feedback network to control the output common-mode level, and by using a differential feedback network in each of the closed-loop feedback circuits. As another example, the amplifier structure could be modified to have a single-ended input structure with a single-ended output structure, as opposed to the differential input structure with single-ended output structure shown in FIG. 1. Such a single-ended input structure could be implemented, for example, by changing the feedback network resistor configuration to implement either a single-ended inverting amplifier structure or a single-ended non-inverting amplifier structure.

A single-ended input structure could also be implemented using many other approaches. For example, a single-ended input structure could be implemented by adding another single-ended input to differential input amplifier structure to precede a differential input structure. This approach could be used to cause a single-ended input signal to be converted to a differential signal before being applied to a differential input structure, such as the differential input structure shown at the input of FIG. 1. As another example, the amplifier structure could be modified to have a differential input, have a differential output and drive a differential load. These alternative differential and single-ended structural changes, among others, could be implemented within the spirit and scope of the subject matter disclosed herein.

Alternative embodiments could make use of a variety of closed-loop feedback loop circuit implementations. The three closed-loop feedback circuits shown in FIGS. 3 and 6 have been described as a first closed-loop feedback circuit, which is an embodiment of the first amplifier 301 in FIG. 3, and as second and third closed-loop feedback circuits, which are embodiments of the second amplifier, e.g., class B amplifier 303 in FIG. 3. However, other embodiments of the first and second amplifier could each be implemented with a different number of closed-loop feedback circuits. For example, if the first and second amplifiers were used to drive a load in an amplifier that only required capability to pull-up the output voltage or capability to pull-down the output voltage, but not both pull-up and pull-down capabilities, then the second amplifier could be implemented with just one closed-loop feedback circuit.

Another example of an embodiment with first and second amplifier having a different number of closed-loop feedback circuits is a first amplifier implemented using two closed-loop feedback circuits. In this example, a first closed-loop feedback circuit could be implemented using a stage that could only provide pull-up capability, and a second closed-loop feedback circuit could be implemented using a stage that could only provide pull-down capability. As another example of an embodiment with first and second amplifiers having a different number of closed-loop feedback circuits is where first and second amplifiers have a differential output structure, each with two output terminals. Each of these output terminals could be implemented with one or two closed-loop feedback circuits to provide pull-up capability, pull-down capability, or combined pull-up and pull-down capability. Different combinations of single-ended and differential output structure and pull-up, pull-down and combined pull-up and pull-down capability are possible. Embodiments of each of first and second amplifiers could have any number of closed-loop feedback circuits, e.g. one, two, three, four closed-loop feedback circuits, be implemented within the spirit and scope of the subject matter disclosed herein.

Alternative embodiments could use many other amplifier structures in the first and second amplifier. For example, amplification stages could be modified to make use of many different configurations of voltage-gain amplification stages, current-gain amplification stages, transconductance amplification stages, and transimpedance amplification stages. In one such alternative embodiment, signals at the input and output of the amplifier could be changed from voltage signals to current signals, the first and second amplifiers could be modified to amplify an input current signal to generate output voltage signals, and output voltage signals from first and second amplifiers could be combined to generate a combined output signal that could either be represented as a voltage or a current.

Additional embodiments using other amplifier structures include multi-stage amplifiers, amplifiers with nested compensation structures, amplifiers implemented with parallel gain stages, and any of the many possible combinations of common amplifier classes including, but not limited to, Class A, Class B, Class AB, Class C, Class D, Class E, Class F, Class G, and Class H structures. Any combination of these different amplifier classes could be used in other alternative embodiments to implement the first amplifier or the second amplifier to achieve any of the various performance advantages of these structures, such as improved efficiency and improved linearity. These alternative structural changes in the first and second amplifier, and many others, could be implemented within the spirit and scope of the subject matter disclosed herein.

III. Conclusion

Methods, systems, and apparatuses are described for a low quiescent current amplifier and driver having multiple amplifiers (e.g. Class AB and B amplifiers) working in concert to independently amplify all or a portion of a signal into multiple amplified signals combined into a unified signal, where operation of a second amplifier is slaved to operation of a first amplifier, each amplifier may have its own feedback loop providing the same gain transfer function to align transitions of the multiple amplified signals, operation of the first amplifier may be detected using a replica of a signal, stage or transconductance in the first amplifier, and at the same threshold, operation of the first and second amplifiers may be transitioned, e.g., the second amplifier may be activated while the first amplifier may be transitioned, which results in the low quiescent current amplifier and driver providing improved performance with smooth transitions between the amplified signals and linear amplification by overcoming threshold and amplification mismatches between the amplifiers without increasing or by reducing manufacturing, implementation and operating costs, substantially as shown in and/or described herein in connection with at least one of the figures, as set forth more completely in the claims.

Embodiments are not limited to the functional blocks, detailed examples, steps, order or the entirety of subject matter presented in the figures, which is why the figures are referred to as exemplary embodiments.

A device, as defined herein, is a machine or manufacture as defined by 35 U.S.C. §101. A device may comprise, for example but not limited to, an amplifier, driver, wireless device, communications device, receiver, transmitter, transceiver, etc. Devices may be digital, analog or a combination thereof Devices may be implemented with any semiconductor technology, including one or more of a Bipolar Junction Transistor (BJT), a heterojunction bipolar transistor (HBT), a metal oxide field effect transistor (MOSFET) device, a metal semiconductor field effect transistor (MESFET) or other transconductor or transistor technology device. Such alternative devices may require alternative configurations other than the configuration illustrated in embodiments presented herein.

Techniques, including methods, described herein may be implemented in hardware (digital and/or analog) or a combination of hardware, software and/or firmware. Techniques described herein may be implemented in one or more components. Embodiments may comprise computer program products comprising logic (e.g., in the form of program code or software as well as firmware) stored on any computer useable medium, which may be integrated in or separate from other components. Such program code, when executed in one or more processors, causes a device to operate as described herein. Devices in which embodiments may be implemented may include storage, such as storage drives, memory devices, and further types of computer-readable media. Examples of such computer-readable media include, but are not limited to, a hard disk, a removable magnetic disk, a removable optical disk, flash memory cards, digital video disks, random access memories (RAMs), read only memories (ROM), and the like. In greater detail, examples of such computer-readable media include, but are not limited to, a hard disk associated with a hard disk drive, a removable magnetic disk, a removable optical disk (e.g., CDROMs, DVDs, etc.), zip disks, tapes, magnetic storage devices, MEMS (micro-electromechanical systems) storage, nanotechnology-based storage devices, as well as other media such as flash memory cards, digital video discs, RAM devices, ROM devices, and the like. Such computer-readable media may, for example, store computer program logic, e.g., program modules, comprising computer executable instructions that, when executed, provide and/or maintain one or more aspects of functionality described herein with reference to the figures, as well as any and all components, steps and functions therein and/or further embodiments described herein.

Proper interpretation of subject matter described herein and claimed hereunder is limited to patentable subject matter under 35 U.S.C. §101. Subject matter described in and claimed based on this patent application is not intended to and does not encompass unpatentable subject matter. As described herein and claimed hereunder, a method is a process defined by 35 U.S.C. §101. As described herein and claimed hereunder, each of a circuit, device, apparatus, machine, system, computer, module, media and the like is a machine and/or manufacture defined by 35 U.S.C. §101.

While a limited number of embodiments have been described, those skilled in the art will appreciate numerous modifications and variations there from. Embodiments have been presented by way of example only, and not limitation. It will be apparent to persons skilled in the relevant art(s) that various changes in form and details can be made therein without departing from the spirit and scope of the disclosed technologies. The exemplary appended claims encompass embodiments and features described herein, modifications and variations thereto as well as additional embodiments and features that fall within the true spirit and scope of the disclosed technologies. Thus, the breadth and scope of the disclosed technologies should not be limited by any of the above-described exemplary embodiments, but should be defined only in accordance with the following claims and their equivalents.

What is claimed is:

1. A device comprising:
   a first amplifier configured to receive and amplify a first signal into a first amplified signal;
   a second amplifier configured to receive and amplify the first signal into a second amplified signal;
   the device configured to combine the first and second amplified signals into a combined amplified signal; and
   a controller configured to slave operation of the second amplifier to operation of the first amplifier,
   wherein the device is configured to activate amplification of the first signal by the second amplifier in response to an activation signal reaching an activation threshold.

2. The device of claim 1, wherein the first amplifier is configured to amplify a first portion of the first signal;
   wherein the second amplifier is configured to amplify a second portion of the first signal; and
   wherein the first and second portions are different.

3. The device of claim 2, wherein the first portion comprises an entirety of the first signal.

4. The device of claim 3,
   wherein the second amplifier is inactive before the first amplified signal reaches the activation threshold.

5. The device of claim 4, wherein the second amplifier is activated after a bias is provided to the second amplifier, the bias being provided when a bias signal based on the first amplified signal reaches a bias threshold.

6. The device of claim 4, wherein the controller is configured to replicate the first amplified signal, the replicated signal indicating the operation of the first amplifier.

7. The device of claim 4, wherein the first amplifier comprises a second stage coupled to an output of a first stage;
   wherein the controller comprises a replica of at least a portion of the second stage coupled to the output of the first stage; and
   wherein operation of the replica provides the controller with a replica of the first amplified signal.

8. The device of claim 1,
   wherein the first amplifier comprises a first feedback and the second amplifier comprises a second feedback; and
   wherein feedback gain ratios of the first and second feedbacks are essentially the same.

9. The device of claim 1, wherein the first amplifier comprises a class AB amplifier and the second amplifier comprises a class B amplifier.

10. The device of claim 9, wherein the first and second amplifiers are configured to be powered by a class G modulated power supply.

11. The device of claim 1, wherein the device comprises a multi-stage loop filter or integrator in a signal path preceding the first and second amplifiers, a first stage of the multi-stage loop filter or integrator comprising a gain stage having gain A and a second stage of the multi-stage loop filter or integrator comprising a transconductance stage having a first transconductance and a differential capacitor load having a first capacitance, the gain stage providing low noise performance and a unity gain crossover frequency that would otherwise require, in absence of the gain stage, a second transconductance larger than the first transconductance and a second capacitance larger than the first capacitance.

12. A method comprising:
   receiving a first signal;
   amplifying, in a first amplifier, the first signal into a first amplified signal;

amplifying, in a second amplifier, the first signal into a second amplified signal;

combining the first and second amplified signals into a combined amplified signal;

controlling operation of the first and second amplifiers by slaving operation of the second amplifier to operation of the first amplifier;

detecting an activation signal based on the first amplified signal has reached an activation threshold; and activating, at the activation threshold, amplification of the first signal by the second amplifier, wherein the second amplifier is inactive before the activation signal reaches the activation threshold.

13. The method of claim 12, wherein the first amplifier amplifies a first portion of the first signal;

wherein the second amplifier amplifies a second portion of the first signal; and wherein the first and second portions are different.

14. The method of claim 12, further comprising:

before activating amplification of the first signal by the second amplifier:

detecting that a bias signal based on the first amplified signal has reached a bias threshold; and providing bias to the second amplifier.

15. The method of claim 12, further comprising:

replicating the first amplified signal, the replicated signal indicating the operation of the first amplifier.

16. The method of claim 12, further comprising:

providing a first feedback to the first amplifier; and providing a second feedback to the second amplifier, wherein the first and second amplifiers are different classes of amplifiers that have essentially the same gain transfer function so that the first and second amplified signals are aligned for combination.

17. A device comprising:

a first output stage configured to receive and amplify a first portion of a first signal into a first amplified signal;

a second output stage configured to receive and amplify a second portion of the first signal into a second amplified signal, the first and second portions being different, wherein each of the first and second portions is one of all and less than all of the first signal;

the device configured to combine the first and second amplified signals into a combined amplified signal;

a first feedback coupled to an output of the first output stage;

a second feedback coupled to an output of the second output stage, the first and second feedbacks having respective feedback gain ratios that are essentially the same;

an activation control having a replica of the first output stage, the activation control configured to slave operation of the second amplifier to operation of the first amplifier indicated by operation of the replica; and a first input stage having an output coupled to an input of the first output stage and to an input of the replica.

18. The device of claim 17, wherein the device is configured to activate amplification of the second portion of the first signal by the second output stage in response to an activation signal reaching an activation threshold; and wherein the second output stage is inactive before the first amplified signal reaches the activation threshold.

19. The device of claim 17, wherein the first amplifier comprises a class AB amplifier and the second amplifier comprises a class B amplifier.

20. The device of claim 18, wherein the second amplifier is activated after a bias is provided to the second amplifier, the bias being provided when a bias signal based on the first amplified signal reaches a bias threshold.

* * * * *